US012796077B2

(12) United States Patent
Yoo

(10) Patent No.: US 12,796,077 B2
(45) Date of Patent: Nov. 10, 2026

(54) SEMICONDUCTOR DEVICE WITH SOURCE/DRAIN REGIONS SPACED APART IN VERTICAL DIRECTION

(71) Applicant: Samsung Electronics Co., Ltd., Suwon-si (KR)

(72) Inventor: Donggon Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 458 days.

(21) Appl. No.: 18/493,241

(22) Filed: Oct. 24, 2023

(65) Prior Publication Data

US 2024/0321888 A1 Sep. 26, 2024

(30) Foreign Application Priority Data

Mar. 21, 2023 (KR) ........................ 10-2023-0036906

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ......... *H10D 84/856* (2025.01); *H10D 30/014* (2025.01); *H10D 30/43* (2025.01);

(Continued)

(58) Field of Classification Search

CPC ............ H10D 30/6735; H10D 64/251; H10W 20/023; H10W 20/42

(Continued)

(56) References Cited

U.S. PATENT DOCUMENTS 11,309,240 B2 4/2022 Liao et al.
2010/0032764 A1 2/2010 Andry et al.

(Continued)

FOREIGN PATENT DOCUMENTS

KR 10-2022-0104617 A 7/2022

OTHER PUBLICATIONS

Extended European Search Report dated Aug. 6, 2024 issued in European Patent Application No. 24164411.1-1211.

*Primary Examiner* — Eliseo Ramos Feliciano
*Assistant Examiner* — Mikka Liu
(74) *Attorney, Agent, or Firm* — HARNESS, DICKEY & PIERCE, P.L.C.

(57) ABSTRACT

A semiconductor device may include: insulating patterns; a device isolation layer on side surfaces of the insulating patterns; gate structures; source/drain regions on the insulating patterns; a via structure between the gate structures and between the source/drain regions; and contact structures connected to the source/drain regions and the via structure, wherein the source/drain regions may include first source/drain regions and second source/drain, wherein the via structure may extend from the same level as lower surfaces of the first source/drain regions to the same level as upper surfaces of the second source/drain regions, and the via structure may include a portion in which a width of the via structure increases and then decreases or decreases and then increases, wherein the contact structures may include a first contact structure contacting the first source/drain regions and a second contact structure contacting the second source/drain regions.

20 Claims, 26 Drawing Sheets

(51) Int. Cl.

| | |
|---|---|
| ***H10D 84/01*** | (2025.01) |
| ***H10D 84/03*** | (2025.01) |
| ***H10D 88/00*** | (2025.01) |
| ***H10W 20/41*** | (2026.01) |

(52) U.S. Cl.

CPC ..... *H10D 30/6729* (2025.01); *H10D 30/6735* (2025.01); *H10D 62/121* (2025.01); *H10D 84/0167* (2025.01); *H10D 84/017* (2025.01); *H10D 84/0186* (2025.01); *H10D 84/038* (2025.01); *H10D 88/01* (2025.01); *H10W 20/427* (2026.01)

(58) Field of Classification Search

USPC .......................................................... 257/351

See application file for complete search history.

(56) References Cited

U.S. PATENT DOCUMENTS

| | | | | |
|---|---|---|---|---|
| 2012/0088367 | A1 | 4/2012 | Sekar et al. | |
| 2017/0040296 | A1 | 2/2017 | Das et al. | |
| 2019/0288004 | A1 | 9/2019 | Smith et al. | |
| 2021/0305252 | A1 | 9/2021 | Chiang et al. | |
| 2021/0336004 | A1 | 10/2021 | Huang et al. | |
| 2021/0375761 | A1 | 12/2021 | Chang et al. | |
| 2022/0216340 | A1 | 7/2022 | Lin et al. | |
| 2022/0230947 | A1 | 7/2022 | Park et al. | |
| 2022/0359679 | A1 | 11/2022 | Lu et al. | |
| 2023/0037957 | A1* | 2/2023 | Thomas ............... | H10D 84/856 |
| 2023/0069137 | A1 | 3/2023 | Tsai et al. | |
| 2023/0073078 | A1* | 3/2023 | Rachmady ............. | H10D 86/60 |

* cited by examiner

SEMICONDUCTOR DEVICE WITH SOURCE/DRAIN REGIONS SPACED APART IN VERTICAL DIRECTION

CROSS-REFERENCE TO RELATED APPLICATION(S)

This application claims the benefit of priority to Korean Patent Application No. 10-2023-0036906, filed on Mar. 21, 2023, in the Korean Intellectual Property Office, the subject matter of which is hereby incorporated by reference in its entirety.

BACKGROUND

Various example embodiments relate to a semiconductor device.

As a demand or desire for high performance, high speed, and/or multifunctionality of semiconductor devices increase, a degree of integration of semiconductor devices is increasing. In manufacturing a semiconductor device with a fine pattern corresponding to the trend for high integration of semiconductor devices, it is necessary or desirable to implement patterns having a fine width or a fine separation distance. Alternatively or additionally, in order to improve the degree of integration, efforts are being made to develop a semiconductor device having a Back Side Power Delivery Network (BSPDN) structure in which power rails are disposed on a rear surface of a wafer or a substrate.

SUMMARY

Various example embodiments may provide a semiconductor device having an improved degree of integration and electrical characteristics.

According to some example embodiments, a semiconductor device, may include insulating patterns extending in a first direction, a device isolation layer on side surfaces of the insulating patterns, gate structures crossing the insulating patterns and extending in a second direction; source/drain regions on the insulating patterns on at least one side of the gate structures, a via structure between the gate structures and between the source/drain regions, and contact structures connected to at least one of the via structure or the source/drain regions, wherein the source/drain regions include first source/drain regions and second source/drain regions spaced apart from the first source/drain regions in a vertical direction, perpendicular to the first direction and to the second direction, wherein the via structure extends from a same level as lower surfaces of the first source/drain regions to a same level as upper surfaces of the second source/drain regions, and in a cross-section thereof in the second direction, the via structure includes a portion in which a width of the via structure increases and then decreases or decreases and then increases in the vertical direction, wherein the contact structures include a first contact structure contacting lower surfaces of the first source/drain regions and a second contact structure contacting upper surfaces of the second source/drain regions.

Alternatively or additionally according to some example embodiments, a semiconductor device may include insulating patterns extending in a first direction, a device isolation layer on side surfaces of the insulating patterns, gate structures crossing the insulating patterns and extending in a second direction, source/drain regions on the insulating patterns on at least one side of the gate structures, a via structure between the gate structures and the between the source/drain regions, and contact structures connected to at least one of the via structure or the source/drain regions, wherein the source/drain regions include first source/drain regions and second source/drain regions spaced apart from the first source/drain regions in a vertical direction, perpendicular to the first direction and to the second direction, wherein the via structure extends from a same level as lower surfaces of the first source/drain regions to a same level as upper surfaces of the second source/drain regions, and in a cross-section in the second direction, the via structure includes a portion in which a width of the via structure decreases from an upper surface of each of the first source/drain regions toward a lower surface of each of the second source/drain regions in the vertical direction, and includes a portion in which a width of the via structure increases and then decreases from an upper surface of each of the second source/drain regions toward a lower surface of each of the second source/drain regions in the vertical direction.

Alternatively or additionally according to some example embodiments, a semiconductor device may include insulating patterns extending in a first direction, a device isolation layer surrounding the insulating patterns, a plurality of channel layers on the insulating patterns to be spaced apart from each other in a vertical direction, perpendicular to an upper surface of the device isolation layer, barrier layers on the insulating patterns to be spaced apart from each other in the vertical direction, gate structures crossing the insulating patterns and surrounding the plurality of channel layers, respectively, and extending in a second direction, source/drain regions on the insulating patterns on at least one side of the gate structures, a via structure between the gate structures and between the source/drain regions, and contact structures connected to at least one of the via structure or the source/drain regions, wherein the barrier layers include an upper barrier layer on an uppermost channel layer among the plurality of channel layers, a lower barrier layer below a lowermost channel layer among the plurality of channel layers, and intermediate barrier layers alternately disposed with the plurality of channel layers, wherein the source/drain regions include first source/drain regions and second source/drain regions spaced part from the first source/drain regions in the vertical direction, wherein the via structure extends from a same level as lower surfaces of the first source/drain regions to a same level as upper surfaces of the second source/drain regions, and in a cross-section in the second direction, a maximum width of the via structure may be above the intermediate barrier layers and below the upper barrier layer or on a level higher than the lower barrier layer and lower than the intermediate barrier layers.

BRIEF DESCRIPTION OF DRAWINGS

The above and other aspects, features, and advantages of various example embodiments will be more clearly understood from the following detailed description, taken in conjunction with the accompanying drawings.

FIGS. 6A, 7A, 8, 9A, 10A, 14, 15, 18A, and 19A illustrate cross-sections corresponding to FIG. 2A, and FIGS. 6B, 7B, 9B, 10B, 11, 12, 13, 16, 17, 18B, and 19B illustrate cross-sections corresponding to FIG. 2B.

DETAILED DESCRIPTION

Figure 1:
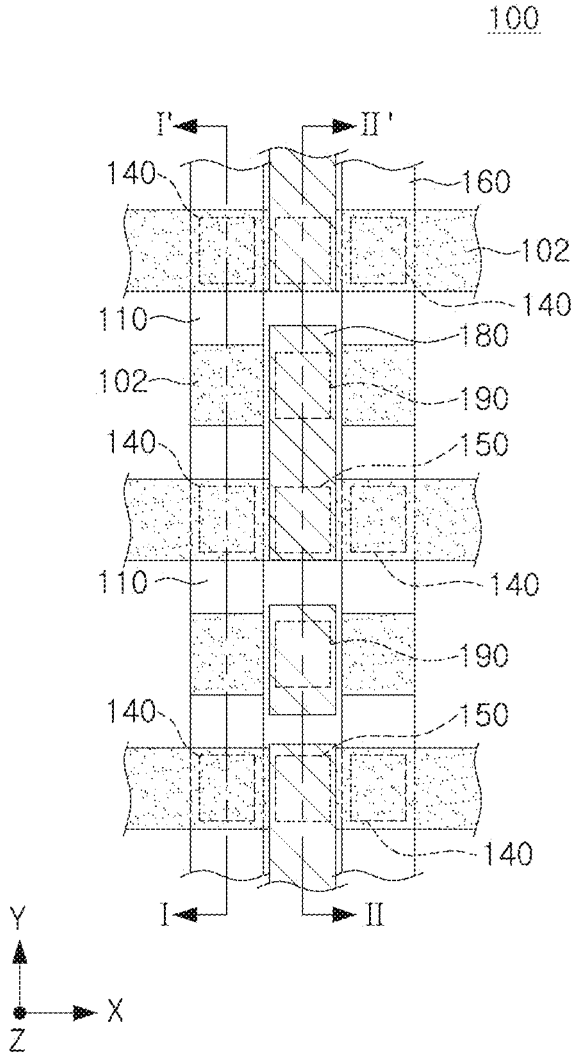
FIG. 1 is a plan view illustrating a semiconductor device according to some example embodiments.

Hereinafter, with reference to the accompanying drawings, various example embodiments will be described as follows. Hereinafter, terms such as 'above', 'upper portion', 'upper surface', 'below', 'lower surface', 'side surface', 'side surface', 'high', 'low' may be understood as referring to the drawings, except for the case otherwise indicated by reference numerals.

FIG. 1 is a plan view illustrating a semiconductor device according to some example embodiments.

Figure 2A:
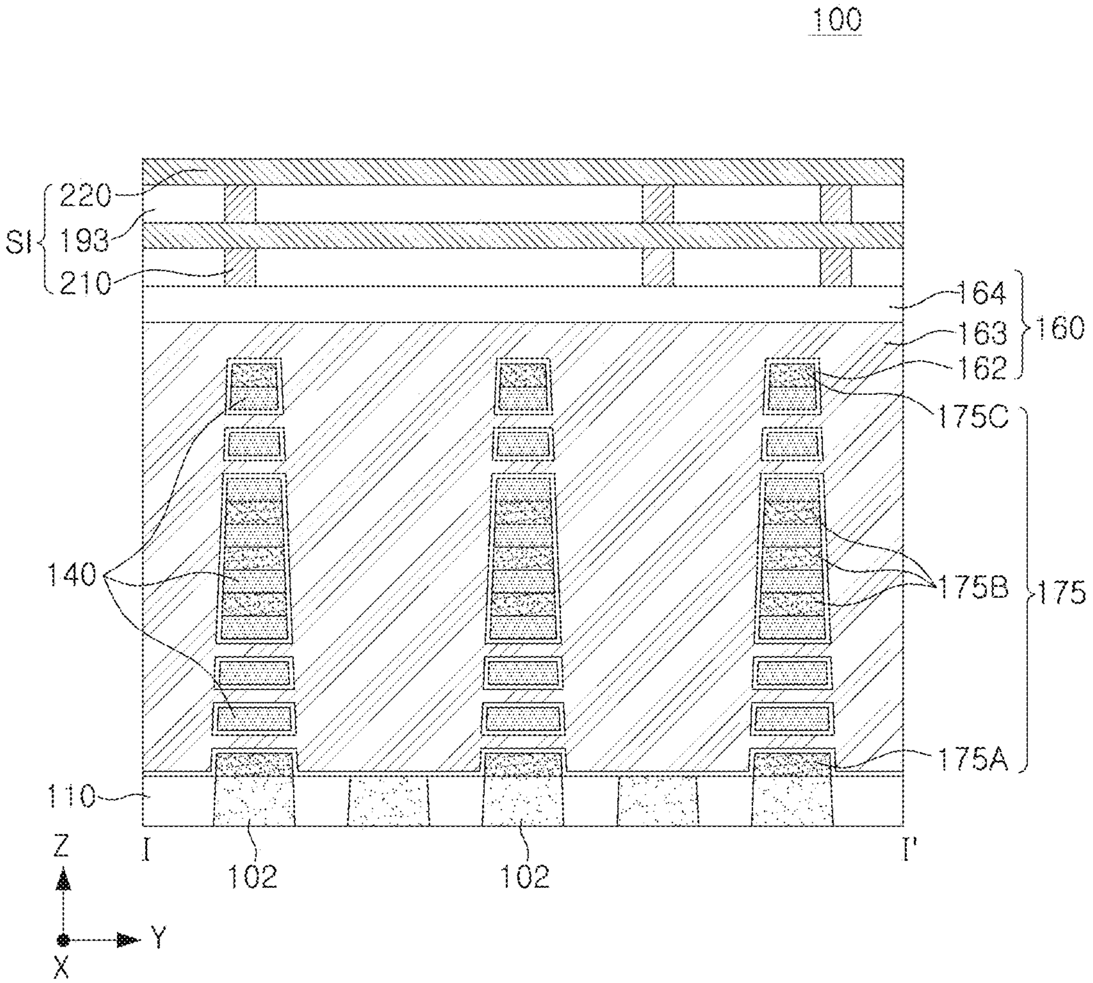
FIGS. 2A and 2B are cross-sectional views illustrating a semiconductor device according to some example embodiments.
Figure 2B:
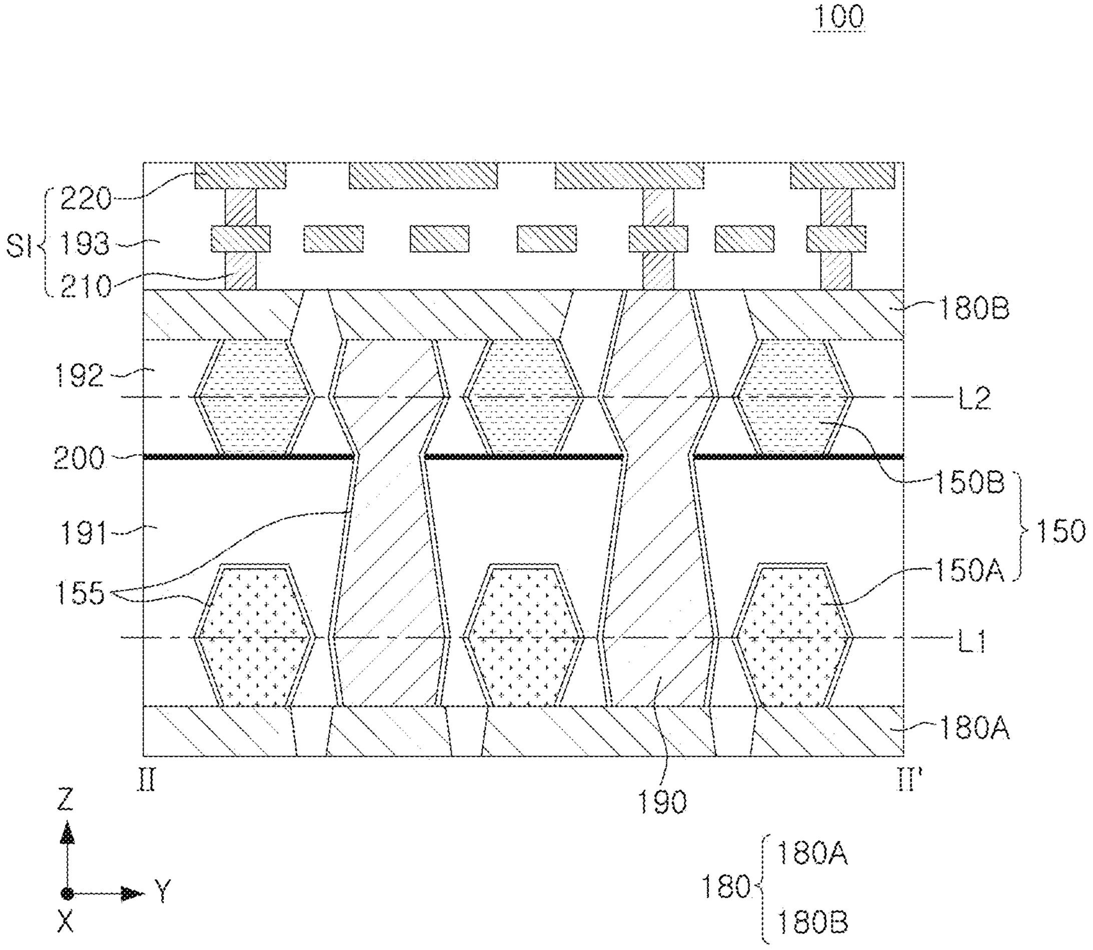

FIGS. 2A and 2B are cross-sectional views illustrating semiconductor devices according to some example embodiments. FIGS. 2A and 2B illustrate cross-sections of the semiconductor device of FIG. 1 taken along cutting lines I-I' and II-II', respectively. For convenience of description, only some components of the semiconductor device are illustrated in FIG. 1.

Referring to FIGS. 1 to 2B, the semiconductor device 100 may include insulating patterns 102, a device isolation layer 110, a channel structure 140, barrier layers 175, a gate structure 160, source/drain regions 150, a via structure 190, contact structures 180, a boundary layer 200, and a capping layer 155. The semiconductor device 100 may further include a number of interlayer insulating layers such as first to third interlayer insulating layers 191, 192, and 193, and an interconnection structure SI. The semiconductor device 100 may include transistors having a Multi Bridge Channel Field Effect Transistor (MBCFET™) structure, which is or has a gate-all-around field effect transistor structure.

The insulating patterns 102 may be disposed to extend in a first direction, for example, an X-direction. According to some example embodiments, a portion of the insulating patterns 102 may not extend in the X-direction. The insulating patterns 102 may be formed in a region from which an active region 105 to be described later is removed. A device isolation layer 110 may be located between adjacent insulating patterns 102 along a Y-direction. Upper surfaces of the insulating patterns 102 may be located on a different level from the upper surface of the device isolation layer 110, but example embodiments are not limited thereto. The insulating patterns 102 may include, for example, an oxide, nitride, or a combination thereof.

The device isolation layer 110 may fill a gap between the insulating patterns 102. The device isolation layer 110 may include or be formed by, for example, a shallow trench isolation (STI) process such as but not limited to a high-density plasma (HDP STI process and/or a spin-on glass (SOG) STI process. The device isolation layer 110 may expose upper or lower surfaces of the insulating patterns 102, and may partially expose upper or lower portions of the insulating patterns 102. The device isolation layer 110 may include, e.g., be formed of an insulating material. The device isolation layer 110 may include, for example, an oxide, nitride, or a combination thereof.

The channel structure 140 may include two or more channel layers 140 disposed to be spaced apart from each other in a direction perpendicular to lower surfaces of the insulating patterns 102 on the insulating patterns 102, for example, in a Z-direction. According to various example embodiments, the channel structure 140 may not be disposed on the insulating patterns 102 not extending in an X-direction. The plurality of channel layers 140 may be spaced apart from upper surfaces of the insulating patterns 102 while being connected to the source/drain regions 150. The plurality of channel layers 140 may have the same or similar width as the insulating patterns 102 in the Y-direction, and may have the same or similar width as the gate structure 160 in the X-direction. According to various example embodiments, a width of the plurality of channel layers 140 in the Y-direction may decrease in a direction away from the upper surfaces of the insulating patterns 102.

The plurality of channel layers 140 may include, e.g., be formed of a semiconductor material such as an epitaxial semiconductor material, and may include, for example, silicon (Si) and/or silicon germanium (SiGe). The number and shape of the plurality of channel layers 140 forming one channel structure 140 may be variously changed in various example embodiments. For example, according to some example embodiments, the channel structure 140 may further include a channel layer disposed on upper surfaces of the insulating patterns 102.

The barrier layers 175 may be disposed on the insulating patterns 102 to be spaced apart from each other in the Z-direction. The barrier layers 175 may include a lower barrier layer 175A disposed below a lowermost channel layer among the plurality of channel layers 140, an upper barrier layer 175C disposed above an uppermost channel layer among the plurality of channel layers 140, and intermediate barrier layers 175B alternately disposed with the plurality of channel layers 140.

According to various example embodiments, the first source/drain regions 150A and the second source/drain regions 150B may be spaced apart from each other in a vertical direction due to the barrier layers 175. For example, the source/drain regions 150 may be located on different levels from the barrier layers 175. According to various example embodiments, the first source/drain regions 150A may be disposed on a level lower than the intermediate barrier layers 175B and higher than the lower barrier layer 175A. The second source/drain regions 150B may be disposed at a level lower than the upper barrier layer 175C and higher than the intermediate barrier layers 175B. Lower surfaces of the first source/drain regions 150A may be located on substantially the same level as the upper surface of the lower barrier layer 175A of FIG. 2A and the lower surface of the via structure 190 of FIG. 2B.

The barrier layers 175 may include, for example, at least one of silicon oxide, silicon nitride, and silicon oxynitride. According to various example embodiments, the barrier layers 175 may include SiN.

The gate structure 160 may be disposed to cross the insulating patterns 102 and the channel structures 140 above the insulating patterns 102 and the channel structures 140 and extend in one direction, for example, in the Y-direction. The gate structure 160 may surround each of the plurality of channel layers 140. Channel regions of transistors may be formed in the channel structures 140 crossing the gate structure 160. The gate structure 160 may include a gate electrode layer 163, a gate dielectric layer 162 between the gate electrode layer 163 and the plurality of channel layers 140, a gate capping layer 164 on an upper surface of the gate electrode layer 163. Although not illustrated, the gate structure 160 may further include gate spacer layers on side surfaces of the gate electrode layer 163.

The gate dielectric layer 162 may be disposed between the insulating patterns 102 and the gate electrode layer 163 and between the channel structure 140 and the gate electrode layer 163, and may be disposed to cover at least a portion of surfaces of the gate electrode layer 163. For example, the gate dielectric layer 162 may be disposed to surround all surfaces except for an uppermost surface of the gate electrode layer 163. The gate dielectric layer 162 may extend between the gate electrode layer 163 and the gate spacer layers, but example embodiments are not limited thereto. The gate dielectric layer 162 may include one or more of an oxide, nitride, or high-k material. The high-k material may mean a dielectric material having a higher dielectric constant than silicon oxide ($SiO_2$). The high dielectric constant material may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode layer 163 may be disposed to extend upwardly of the channel structure 140 while filling gaps between the plurality of channel layers 140. The gate electrode layer 163 may be spaced apart from the plurality of channel layers 140 by the gate dielectric layer 162. The gate electrode layer 163 may include a conductive material. For example, the gate electrode layer 163 may include a metal nitride (e.g., at least one of titanium nitride (TiN), tantalum nitride (TaN), and tungsten nitride (WN)), a metal material (e.g., at least one of aluminum (Al), tungsten (W), and molybdenum (Mo)), and silicon (e.g., doped polysilicon).

The gate electrode layer 163 may be comprised of two or more multilayer structures. Gate spacer layers may be disposed on both side surfaces of the gate electrode layer 163. The gate spacer layers may insulate the source/drain regions 150 and the gate electrode layer 163. The gate spacer layers may have a multilayer structure according to some example embodiments. The gate spacer layers may include at least one of oxide, nitride, oxynitride, and low-k dielectric.

The gate capping layer 164 may be disposed above the gate electrode layer 163, and a lower surface of the gate capping layer 164 may be surrounded by the gate electrode layer 163 and the gate spacer layers.

The source/drain regions 150 may include second source/drain regions 150B and first source/drain regions 150A spaced apart from the second source/drain regions 150B in the Z-direction.

The source/drain regions 150 may be provided as a source region or a drain region of a transistor. The source/drain regions 150 may be disposed in recess regions partially recessing an upper portion of the active region 105 on both sides of the gate structure 160. The source/drain regions 150 may be disposed to cover side surfaces of each of the plurality of channel layers 140. According to various example embodiments, source/drain regions 150 may be disposed on insulating patterns 102.

The source/drain regions 150 may include a plurality of epitaxial layers, but example embodiments are not limited thereto. The source/drain regions 150 may be or may include semiconductor layers including silicon (Si) and/or germanium (SiGe). The source/drain regions 150 may include different types, depths, and/or concentrations of impurities. The first source/drain regions 150A and the second source/drain regions 150B may have different conductivity types. According to various example embodiments, the second source/drain regions 150B may include n-type doped silicon (Si) and/or the first source/drain regions 150A may include p-type doped silicon germanium (SiGe). However, example embodiments are not limited thereto, and according to some example embodiments, the second source/drain regions 150B may include p-type doped silicon germanium (SiGe) and/or the first source/drain regions 150A may include n-type doped silicon (Si). In various example embodiments, the source/drain regions 150 may include a plurality of regions including different concentrations of elements and/or doping elements.

In some example embodiments, the first and/or second source/drain regions 150A and 150B may include both n-type dopants and p-type dopants. For example, in some example embodiments, the first source/drain region 150A and/or the second source/drain region 150B may include n-type dopants at a first concentration and p-type dopants at a second concentration, much different from (much lower than or much greater than) that of n-type dopants. Example embodiments are not limited thereto.

The second source/drain regions 150B may include silicon (Si), and may include impurities of different elements and/or concentrations. Each of the second source/drain regions 150B may be spaced apart from each other in a first direction X. Each of the second source/drain regions 150B may be spaced apart from each other in a second direction Y. The second source/drain regions 150B may have n-type conductivity, and may be epitaxially grown layers. For example, the epitaxial layer may include any one of phosphorus (P) and arsenic (As) as a doping element.

Each of the first source/drain regions 150A may be spaced apart from each other in a first direction X, and may vertically overlap the second source/drain regions 150B. Each of the first source/drain regions 150A may be spaced apart from each other in a second direction Y. The first source/drain regions 150A may be changed according to the shape of the plurality of channel layers 140 and the shape of the gate structure 160. The first source/drain regions 150A may include a plurality of epitaxial layers, and the number and/or the shape of the epitaxial layers may be variously changed in various example embodiments. The first source/drain regions 150A may include silicon germanium (SiGe) doped with a Group III element and may have a p-type conductivity. For example, the first source/drain regions 150A may include any one of boron (B), aluminum (Al), gallium (Ga), indium (In), and thallium (TI) as a doping element.

The via structure 190 may be disposed between the gate structures 160 and between the source/drain regions 150. A width of the via structure 190 may include a portion that increases and then decreases, and/or that decreases and then increases in the Z-direction. In a cross-section thereof in the Y-direction, the via structure 190 may include a portion in which a width of the via structure 190 decreases from an upper surface of each of the first source/drain regions 150A to a lower surface of each of the second source/drain regions 150B in the Z-direction, and may include a portion in which a width of the via structure 190 increases and then decreases from an upper surface of each of the second source/drain regions 150B to a lower surface of each of the second source/drain regions 150B in the Z-direction. The width of the via structure 190 may be minimum on substantially the same level as the boundary layer 200 and the lower surface of each of the second source/drain regions 150B.

In a first region below the boundary layer 200, a level L1 at which the via structure 190 has a maximum width may be substantially the same as a level L1 at which each of the first source/drain regions 150A has a maximum width. In a second region above the boundary layer 200, a level L2 at which the via structure 190 has a maximum width may be substantially the same as a level L2 at which each of the first source/drain regions 150B has a maximum width. In the first region below the boundary layer 200, a first width, which is the maximum width of the via structure 190, may be substantially the same as a second width, which is the maximum width of the via structure 190, in the second region above the boundary layer 200, but example embodiments are not limited thereto.

An upper or lower surface of the via structure 190 may be located on substantially the same level as the upper or lower surface of at least one of the contact structures 180. According to various example embodiments, the lower surface of the first source/drain regions 150A and the lower surface of the via structure 190 may be disposed at substantially the same level. The contact structures 180 and the via structure 190 may be formed of the same material, but example embodiments are not limited thereto. The via structure 190 may include at least one of a metal material, for example, aluminum (Al), copper (Cu), tungsten (W), cobalt (Co), ruthenium (Ru), and molybdenum (Mo). According to various example embodiments, the via structure 190 may include a molybdenum (Mo) layer such as a monocrystalline molybdenum layer. The via structure 190 may be formed in a single crystal structure.

Since resistance is reduced by the via structure 190 including a portion in which a width of the via structure 190 increases in the Z-direction and then decreases or decreases and then increases, a semiconductor device 100 having improved integration and/or electrical characteristics may be provided.

The contact structures 180 may include a second contact structure 180B electrically connected to the second source/drain regions 150B and a first contact structure 180A electrically connected to the first source/drain regions 150A.

The contact structures 180 may be disposed on the source/drain regions 150, and may be disposed to have a longer length in the Y-direction than the source/drain regions 150 according to embodiments. The contact structures 180 may be disposed to recess the source/drain regions 150 to a predetermined depth.

The contact structures 180 may be connected to at least one of the source/drain regions 150 and the via structure 190. The contact structures 180 may include first contact structures 180A connected to at least one of the first source/drain regions 150A and the via structure 190, and second contact structures 180B connected to at least one of the second source/drain regions 150B and the via structure 190. According to various example embodiments, the first contact structure 180A may contact a lower surface of the first source/drain region 150A and a lower surface of the via structure 190, and the second contact structure 180B may contact an upper surface of the second source/drain region 150B and an upper surface of the via structure 190.

The second contact structure 180B may contact the second source/drain regions 150B, and apply an electrical signal to the second source/drain regions 150B. The first contact structure 180A may contact the first source/drain regions 150A, and may apply an electrical signal to the first source/drain regions 150A.

A metal silicide layer may be formed between the source/drain regions 150 and the contact structures 180. In addition, the contact structures 190 may further include a barrier layer extending between the contact structures 190 and the metal silicide layer and extending to side surfaces of the contact structures 190. The barrier layer may include, for example, a metal nitride such as titanium nitride (TiN), tantalum nitride (TaN), or tungsten nitride (WN). The contact structures 180 may include, for example, a metal material such as aluminum (Al), tungsten (W), or molybdenum (Mo). In various example embodiments, the number and/or dispositional form of conductive layers constituting the contact structures 180 may be variously changed.

The boundary layer 200 may be disposed between upper surfaces of the first source/drain regions 150A and lower surfaces of the second source/drain regions 150B. The boundary layer 200 may include, e.g., be formed of an insulating material, but example embodiments are not limited thereto. The boundary layer 200 may be formed of substantially the same material as the capping layer 155, but example embodiments are not limited thereto.

The capping layer 155 may be or include or be included in a protective layer capping the source/drain regions 150. The capping layer 155 may serve as an etch stopper. According to various example embodiments, the capping layer 155 may be disposed on a side surface of the via structure 190 to protect the via structure 190. The capping layer 155 may include, e.g., be formed of an insulating material, but an example embodiment thereof is not limited thereto. The capping layer 155 may include, for example, SiN.

The first to third interlayer insulating layers 191, 192, and 193 may include, for example, at least one of oxide, nitride, oxynitride, and low-k dielectric. The first and second interlayer insulating layers 191 and 192 may be disposed to cover the source/drain regions 150 and the via structure 190. The third interlayer insulating layer 193 may be disposed to cover an interconnection structure SI.

The interconnection structure SI may be disposed above the second source/drain regions 150B, to form a back end of line (BEOL). The interconnection structure SI may include vias 210 electrically connected to the second contact plugs 180B and interconnection layers 220 electrically connected to the vias 210. Although two layers are illustrated in the interconnection structure, example embodiments are not limited thereto.

The interconnection structure SI may be disposed within a third interlayer insulating layer 193, and the third interlayer insulating layer 193 may include, for example, at least one of silicon oxide, silicon nitride, and silicon oxynitride.

Figure 3:
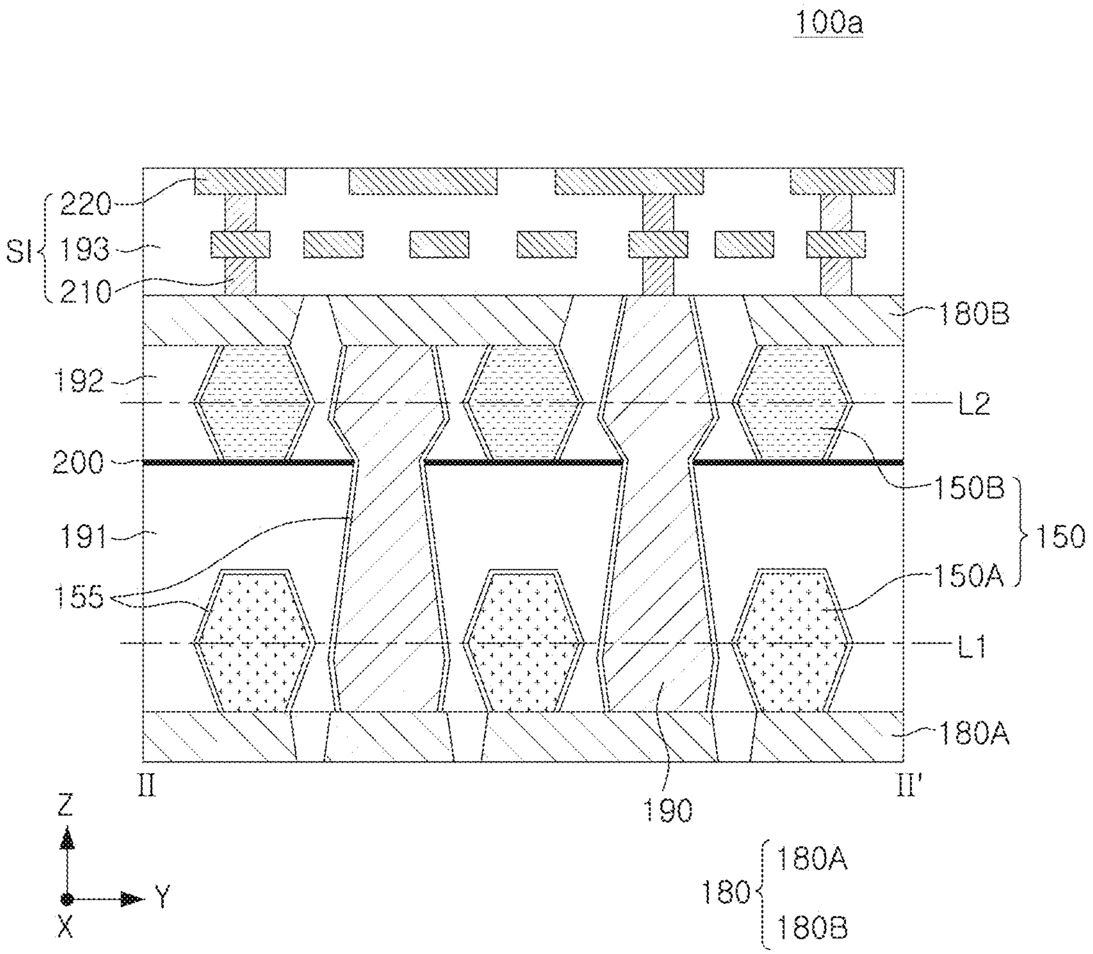
FIGS. 3, 4 and 5 are schematic cross-sectional views illustrating a semiconductor device according to some example embodiments.

FIG. 3 is schematic cross-sectional views illustrating a semiconductor device according to some example embodiments. FIG. 3 illustrates cross-sections corresponding to FIG. 2B.

Referring to FIG. 3, in the Y-direction, unlike the semiconductor device 100 of FIG. 2B where a maximum width of the via structure 190 is located at the same level as the levels L1 and L2 at which each of the source/drain regions 150 has a maximum width, in the semiconductor device 100*a* of FIG. 3, the level at which the via structure 190 has a maximum width may be different from the levels L1 and L2 at which each of the source/drain regions 150 has a maximum width. This may be due to epitaxial growth conditions in the processes of FIGS. 12 and 13 described later. According to various example embodiments, in a second region above a boundary layer 200, the level having the maximum width of the via structure 190 may be lower than the level L2 having the maximum width of each of the second source/drain regions 150B. In a first region below the boundary layer 200, the level having the maximum width of the via structure 190 may be lower than the level L1 having the maximum width of each of the first source/drain regions 150A. However, example embodiments are not limited thereto. In the first region, a relationship between the level having the maximum width of the via structure 190 and the level L1 having the maximum width of each of the first source/drain regions 150A may be independent of a relationship between the level having the maximum width of the structure 190 and the level L2 having the maximum width of each of the second source/drain regions 150B.

According to some example embodiments, in the first region, a level having a maximum width of the via structure 190 may be located on a level higher than a level L1 having a maximum width of each of the first source/drain regions 150A, and in the second region, a level having a maximum width of the via structure 190 may be located on a level higher than a level L2 having a maximum width of each of the second source/drain regions 150B.

Alternatively or additionally in some example embodiments, in the first region, a level having a maximum width of the via structure 190 may be located on a level lower than a level L1 having a maximum width of each of the first source/drain regions 150A, and in the second region, a level having a maximum width of the via structure 190 may be located on a level higher than a level L2 having a maximum width of each of the second source/drain regions 150B.

Alternatively or additionally in to some example embodiments, in the first region, a level having a maximum width of the via structure 190 may be located on a level higher than a level L1 having a maximum width of each of the first source/drain regions 150A, and in the second region, a level having a maximum width of the via structure 190 may be located on a level lower than a level L2 having a maximum width of each of the second source/drain regions 150B.

Figure 4:
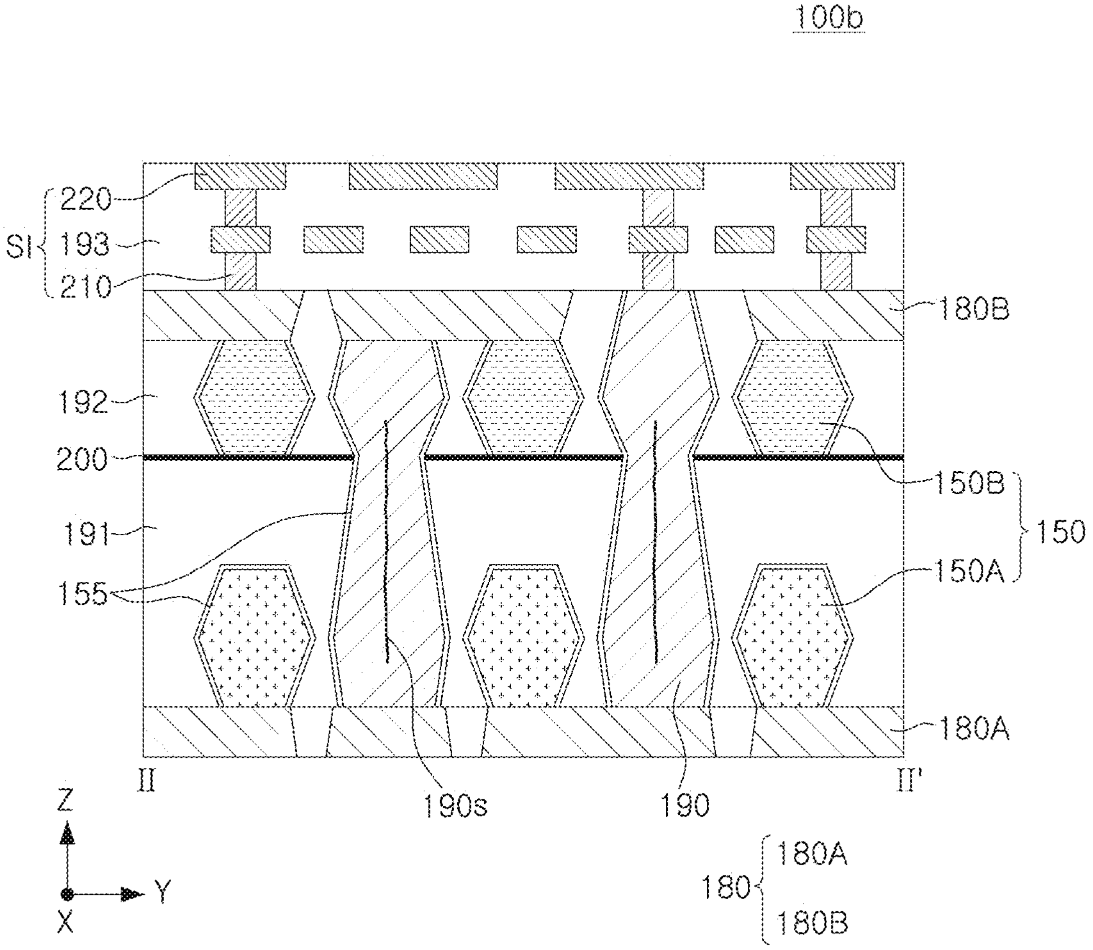

FIG. 4 is schematic cross-sectional views illustrating a semiconductor device according to some example embodiments. FIG. 4 illustrates cross-sections corresponding to FIG. 2B.

Referring to FIG. 4, a via structure 190 of the semiconductor device 100*b* may include or may surround or at least partly surround a seam 190*s*. The seam 190*s* may be formed vertically along a central axis of the via structure 190, but example embodiments are not limited thereto. The via structure 190 may be formed using an atomic layer deposition (ALD) process and/or a chemical vapor deposition (CVD) process. According to various example embodiments, since the via structure 190 may include a polycrystalline material, the seam 190*s* may be formed by a boundary line where crystals (e.g., different grains) meet.

Figure 5:
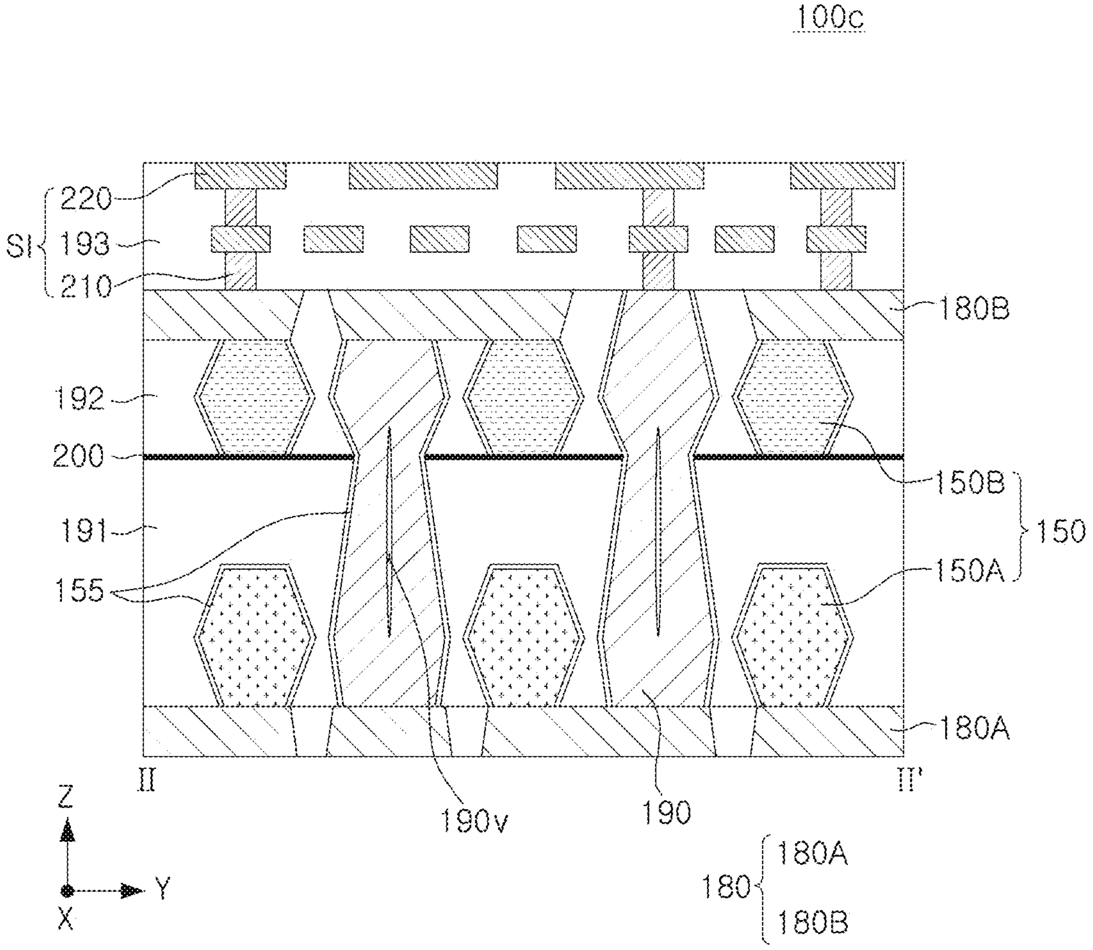

FIG. 5 is schematic cross-sectional views illustrating a semiconductor device according to some example embodiments. FIG. 5 illustrates cross-sections corresponding to FIG. 2B.

Referring to FIG. 5, a void 190*v* may be formed inside a via structure 190 of the semiconductor device 100*c*. According to various example embodiments, since the via structure 190 may include a polycrystalline material, a void 190*v* may be formed between the crystals, e.g., between grains of the crystals. The void 190*v* may be formed in an atomic layer deposition (ALD) process and/or a chemical vapor deposition (CVD) process of the via structure 190. The void 190*v* may include air such as clean dry air, and/or a gas composed of a material used in a manufacturing process of the semiconductor device 100*c*. The void 190*v* may or may not be at atmospheric pressure.

FIGS. 6A, 6B, 7A, 7B, 8, 9A, 9B, 10A, 10B, 11, 12, 13, 14, 15, 16, 17, 18A, 18B, 19A and 19B are cross-sectional views illustrating a manufacturing method of a semiconductor device according to a process sequence according to various example embodiments. In FIGS. 6A, 6B, 7A, 7B, 8, 9A, 9B, 10A, 10B, 11, 12, 13, 14, 15, 16, 17, 18A, 18B, 19A and 19B, various embodiments of a manufacturing method for manufacturing the semiconductor device 100 of FIGS. 1 to 2B is illustrated. FIGS. 6A, 7A, 8, 9A, 10A, 14, 15, 18A, and 19A illustrate cross-sections corresponding to FIG. 2A, and FIGS. 6B, 7B, 9B, 10B, 11, 12, 13, 16, 17, 18B, and 19B illustrate cross-sections corresponding to FIG. 2B.

Figure 6A:
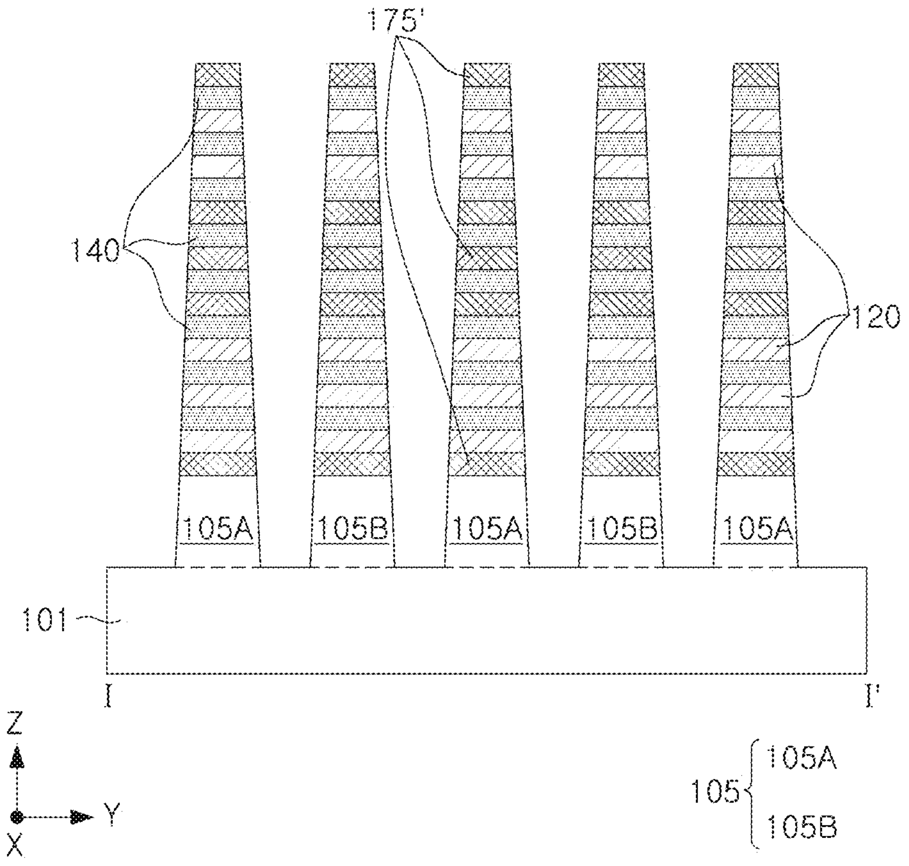
FIGS. 6A, 6B, 7A, 7B, 8, 9A, 9B, 10A, 10B, 11, 12, 13, 14, 15, 16, 17, 18A, 18B, 19A and 19B are cross-sectional views illustrating a manufacturing method of a semiconductor device according to a process sequence according to some example embodiments.
Figure 6B:
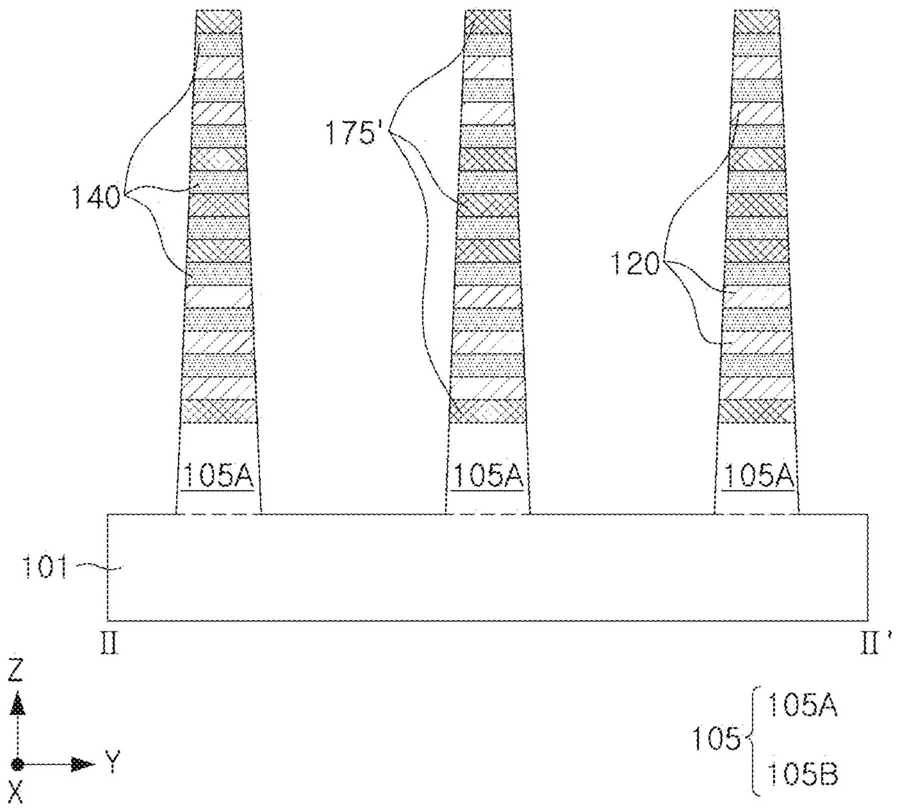

Referring to FIGS. 6A and 6B, sacrificial barrier layers 175', sacrificial layers 120, and a plurality of channel layers 140 may be alternately stacked on a substrate 101. Active structures may be formed by removing a stacked structure of the sacrificial barrier layers 175', the sacrificial layers 120, and the plurality of channel layers 140 and a portion of the substrate 101.

Thicknesses of each of the sacrificial barrier layers 175', sacrificial layers 120, and plurality of channel layers 140 may be the same as each other, or, alternatively, any one or more of the sacrificial barrier layers 175', sacrificial layers 120, and plurality of channel layers 140 may have a thickness different than others thereof.

The substrate 101 may have an upper surface extending in X and Y-directions. The substrate 101 may include a semiconductor material, such as one or more of a Group IV semiconductor, a Group III-V compound semiconductor, or a Group II-VI compound semiconductor. For example, the group IV semiconductor may include silicon, germanium, or silicon-germanium. The substrate 101 may be provided as a bulk wafer, an epitaxial layer, a Silicon On Insulator (SOI) layer, a Semiconductor On Insulator (SeOI) layer, or the like.

The substrate 101 may include active regions 105 disposed thereabove. However, depending on the description method, the active regions 105 may also be described as a separate configuration from the substrate 101.

The active regions 105 may be disposed to extend in a first direction, for example, an X-direction. The active regions 105 may be defined at a predetermined depth from an upper surface thereof in a portion of the substrate 101. The active regions 105 may be formed of a portion of the substrate 101, and/or may include an epitaxial layer grown from the substrate 101. Each of the active regions 105 may include active fins protruding upwardly. The active regions 105 may form an active structure in which a channel region of a transistor is formed together with the channel structures 140. Each of the active regions 105 may include an impurity region. The impurity region may form at least a portion of a well region of a transistor.

The sacrificial layers 120 may be or may include or be included in a layer replaced with the gate dielectric layers 162 and the gate electrode layer 163 through a subsequent process, as illustrated in FIG. 2A. The sacrificial barrier layers 175' may be a layer replaced with the barrier layers 175 through a subsequent process, as illustrated in FIG. 2A. The sacrificial layers 120 may be formed of a material having etch selectivity (e.g., a wet etch selectivity) with respect to the plurality of channel layers 140 and the sacrificial barrier layers 175', respectively. The plurality of channel layers 140 may include a material different from that of the sacrificial layers 120 and the sacrificial barrier layers 175'. The sacrificial layers 120, the sacrificial barrier layers 175', and the plurality of channel layers 140 may include a semiconductor material, for example, at least one of silicon (Si), silicon germanium (SiGe), and germanium (Ge), but may include different materials, and may or may not include impurities. Alternatively, at least two structures among the sacrificial layers 120, the sacrificial barrier layers 175', and the plurality of channel layers 140 may include the same material. In this case, a composition ratio of materials included in the two structures may be different from each other. For example, the sacrificial layers 120 and the sacrificial barrier layers 175' may include silicon germanium (SiGe), and the plurality of channel layers 140 may include silicon (Si).

The sacrificial layers 120, the sacrificial barrier layers 175' and the plurality of channel layers 140 may be formed by performing an epitaxial growth process (e.g., a heteroepitaxial growth process) on the substrate 101. Each of the sacrificial layers 120, the sacrificial barrier layers 175' and the plurality of channel layers 140 may have a thickness in a range of about 1 Å to about 100 nm. The number of layers of the plurality of channel layers 140 alternately stacked with the sacrificial layers 120 and the sacrificial barrier layers 175' may be variously changed in various example embodiments.

Next, the active structures may be formed by patterning upper regions of the sacrificial layers 120, the sacrificial barrier layers 175', the plurality of channel layers 140, and the substrate 101. The active structures may include sacrificial layers 120, sacrificial barrier layers 175', and a plurality of channel layers 140 that are alternately stacked with each other, and may further include active regions 105 formed to protrude from the substrate 101 by removing a portion of the substrate 101. The active regions 105 may include first active regions 105A and second active regions 105B. The first active regions 105A may be formed in a line shape extending in one direction, for example, an X-direction, and may be formed to be spaced apart from each other in a Y-direction. The second active regions 105B may not have a line shape. According to an aspect ratio, side surfaces of the active structures may have an inclined shape so that a width thereof width increases while facing downwardly.

Figure 7A:
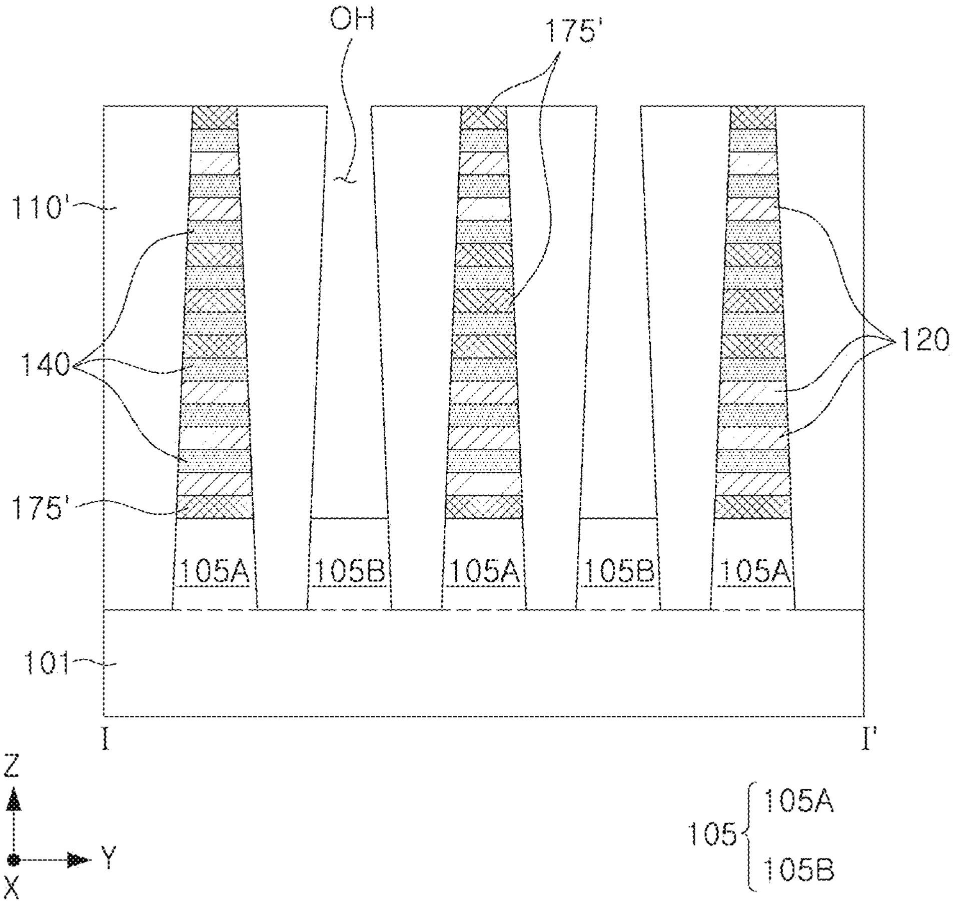
Figure 7B:
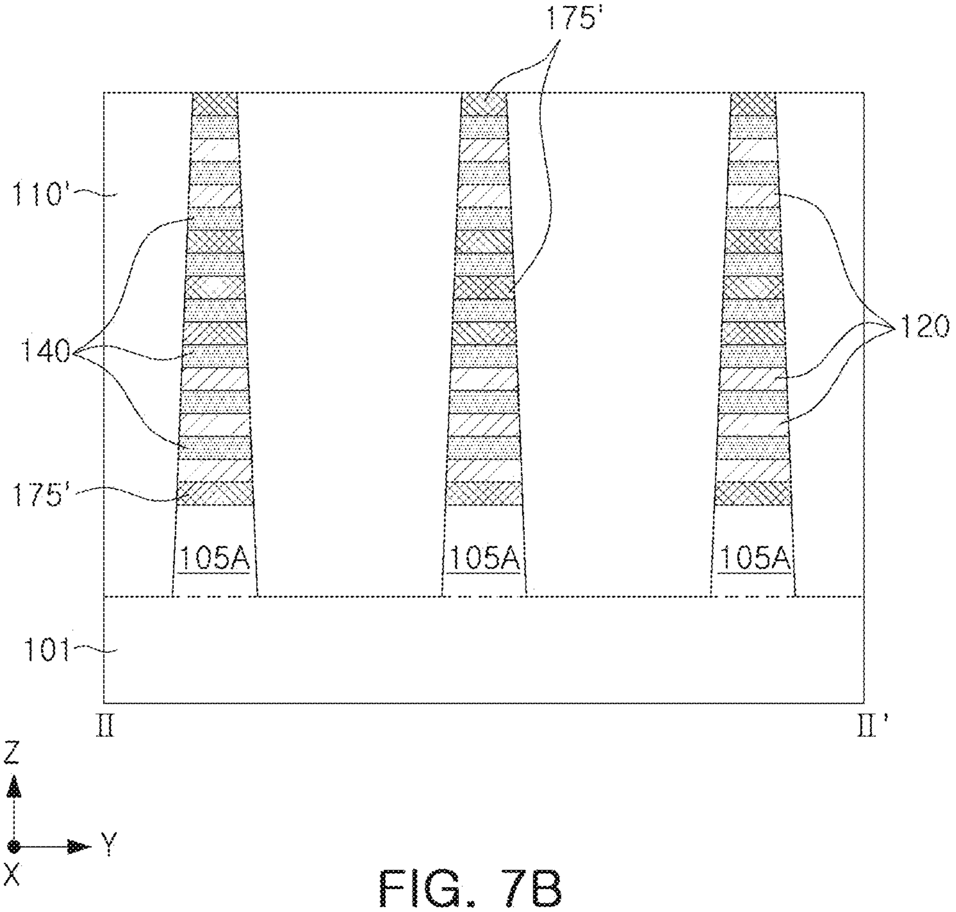

Referring to FIGS. 7A and 7B, openings OH may be formed by removing active structures on the second active regions 105B.

A preliminary device isolation layer 110' may be formed on the active structures. According to various example embodiments, openings OH may be formed by removing the active structures on the second active regions 105B by an etching process.

Figure 8:
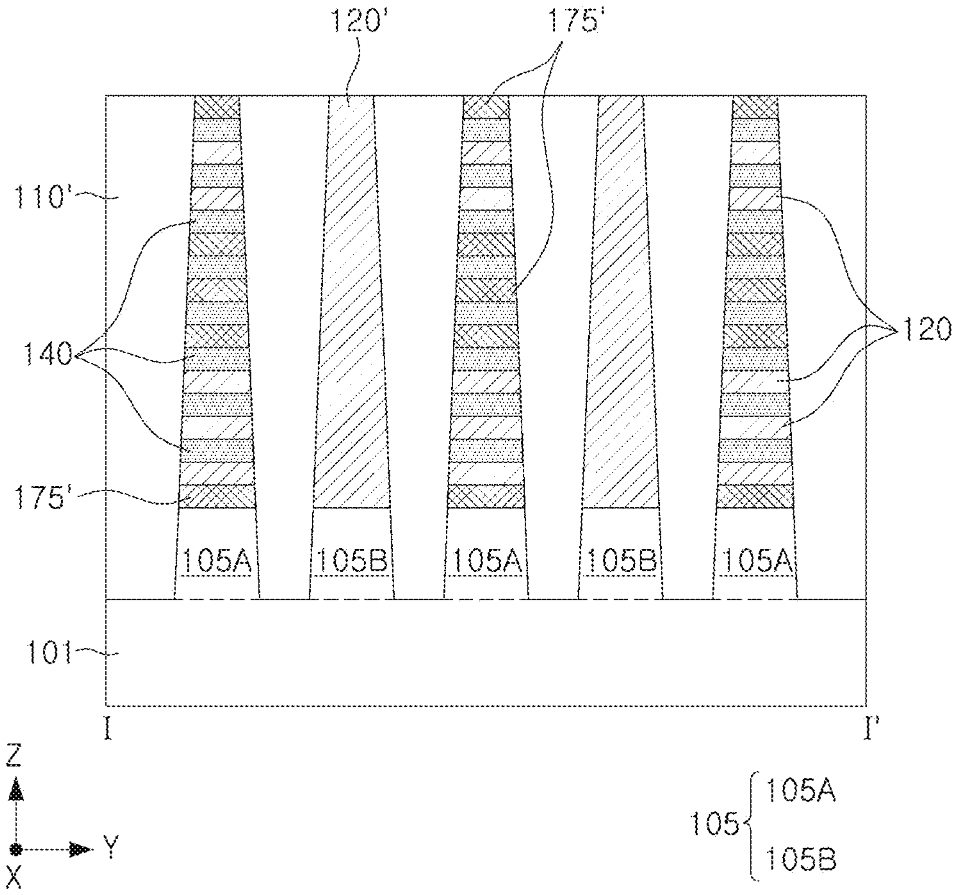

Referring to FIG. 8, auxiliary sacrificial layers 120' may be formed on the second active regions 105B to fill the openings OH.

Figure 12:
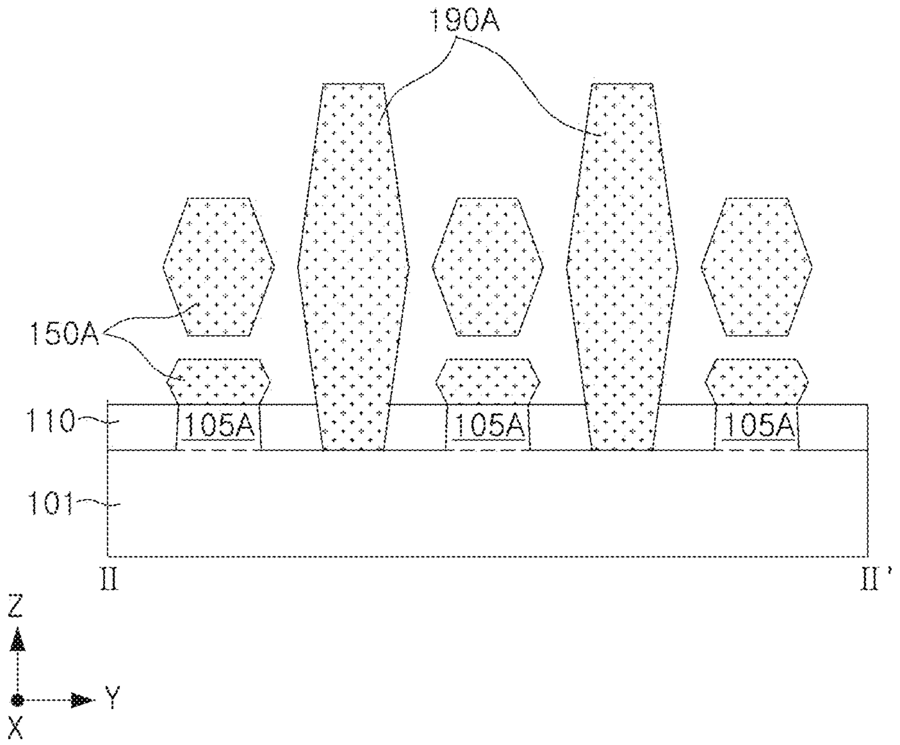

The auxiliary sacrificial layers 120' may be formed by performing an epitaxial growth process on the second active regions 105B. According to various example embodiments, the auxiliary sacrificial layers 120' may be formed of substantially the same material as the sacrificial layers 120, but example embodiments are not limited thereto. For example, the auxiliary sacrificial layers 120' and the sacrificial layers 120 may include silicon germanium (SiGe). A concentration of germanium (Ge) included in the sacrificial layers 120 may be substantially the same as a concentration of germanium (Ge) included in the auxiliary sacrificial layers 120', but example embodiments are not limited thereto. The auxiliary sacrificial layers 120' may serve as seeds in forming first sacrificial epitaxial layers 190A as illustrated in FIG. 12 through a subsequent process. The auxiliary sacrificial layers 120' may have etch selectivity with respect to barrier layers 175 (see FIG. 14) and the plurality of channel layers 140.

Figure 9A:
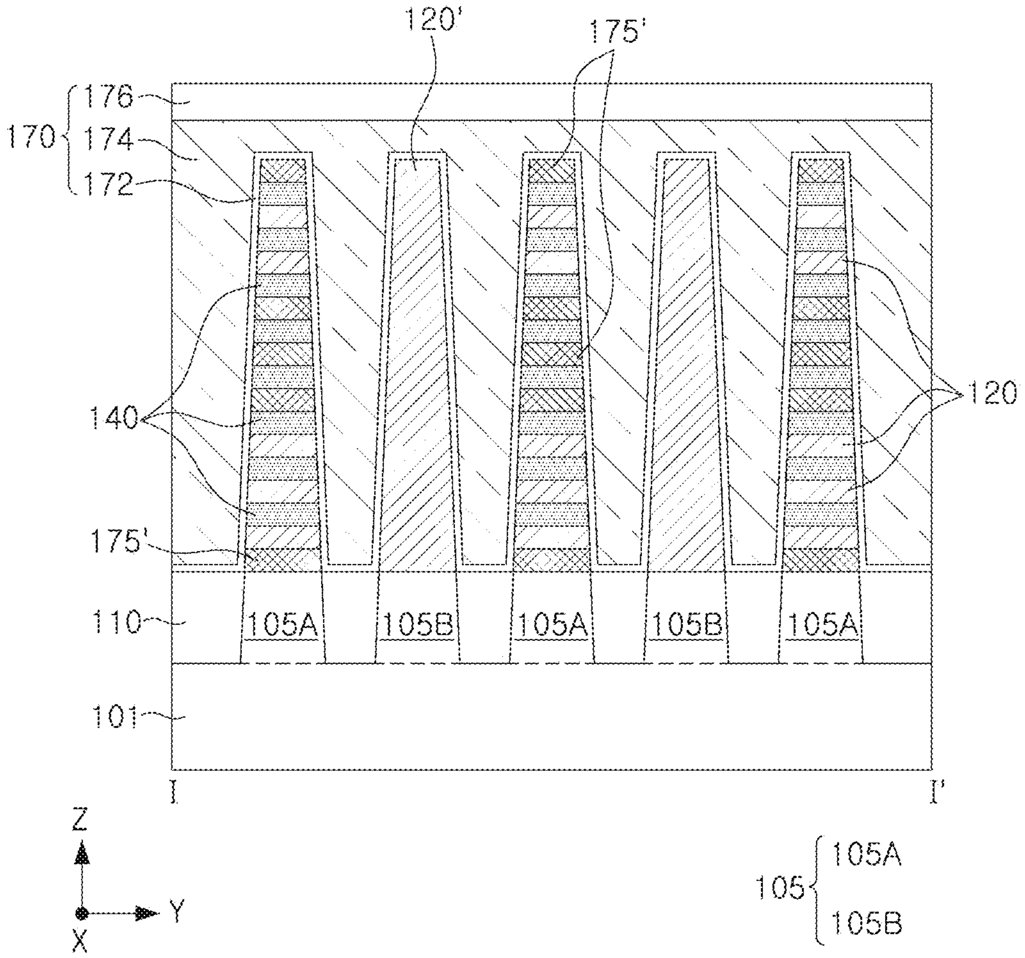
Figure 9B:
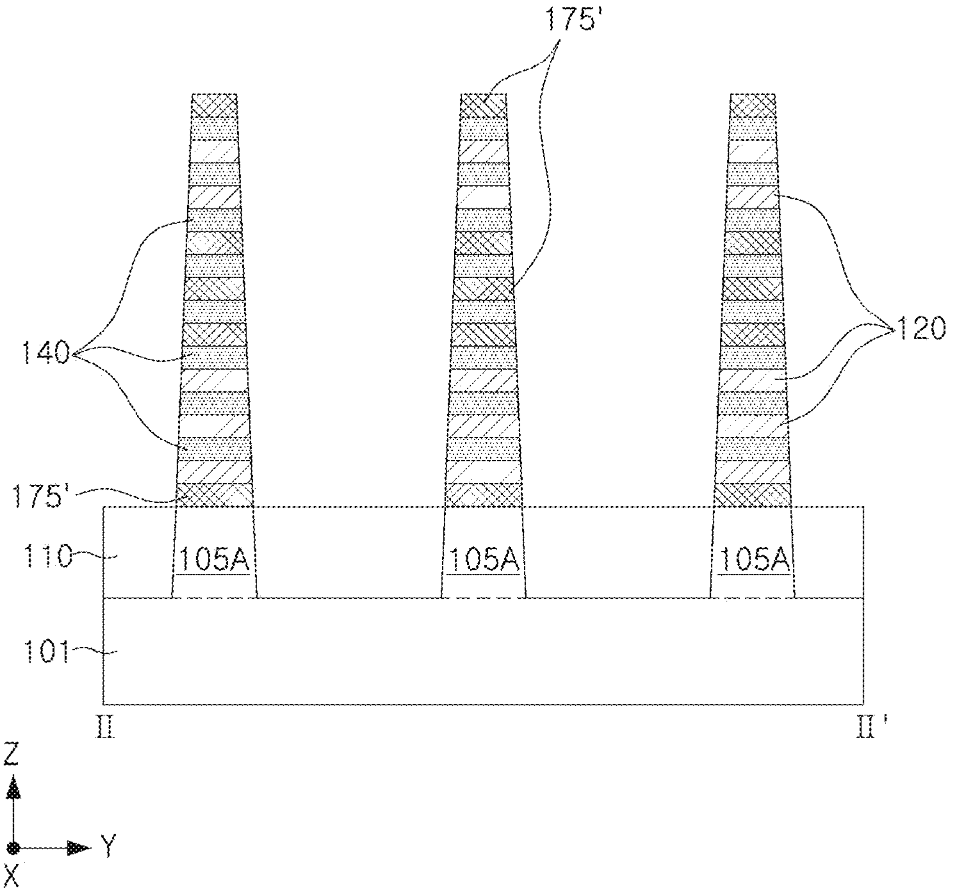

Referring to FIGS. 9A and 9B, a portion of the preliminary device isolation layer 110' may be removed, and sacrificial gate structures 170 and gate spacer layers may be formed on the active structures.

A device isolation layer 110 may be formed by removing a portion of the preliminary device isolation layer 110'. A device isolation layer 110 may be located between adjacent active regions 105 in a Y-direction. An upper surface of the device isolation layer 110 may be on substantially the same level as upper surfaces of the active regions 105, but example embodiments are not limited thereto. Alternatively or additionally, according to some example embodiments, the upper surfaces of the active regions 105 may be located on a higher level than the upper surface of the device isolation layer 110.

The sacrificial gate structures 170 may be sacrificial structures formed in a region in which the gate dielectric layer 162 and the gate electrode layer 163 are disposed on the channel structures 140 through a subsequent process, as illustrated in FIGS. 2A and 2B. The sacrificial gate structures 170 may have a line shape extending in one direction crossing the active structures. The sacrificial gate structures 170 may extend in the Y-direction and be disposed to be spaced apart from each other in the X-direction.

The sacrificial gate structure 170 may include first and second sacrificial gate layers 172 and 174 and a mask pattern layer 176, sequentially stacked. The first and second sacrificial gate layers 172 and 174 may be patterned using the mask pattern layer 176. Each of the first and second sacrificial gate layers 172 and 174 may be an insulating layer and a conductive layer, but example embodiments are not limited thereto, and the first and second sacrificial gate layers 172 and 174 may be formed of one layer. For example, the first sacrificial gate layer 172 may include silicon oxide, and the second sacrificial gate layer 174 may include polysilicon. The mask pattern layer 176 may include silicon oxide and/or silicon nitride.

Although not shown, gate spacer layers may be formed on both sidewalls of the sacrificial gate structures 170. The gate spacer layers may be formed of a low dielectric constant material, and may include, for example, at least one of SiO, SiN, SiCN, SiOC, SiON, and SiOCN.

Figure 10A:
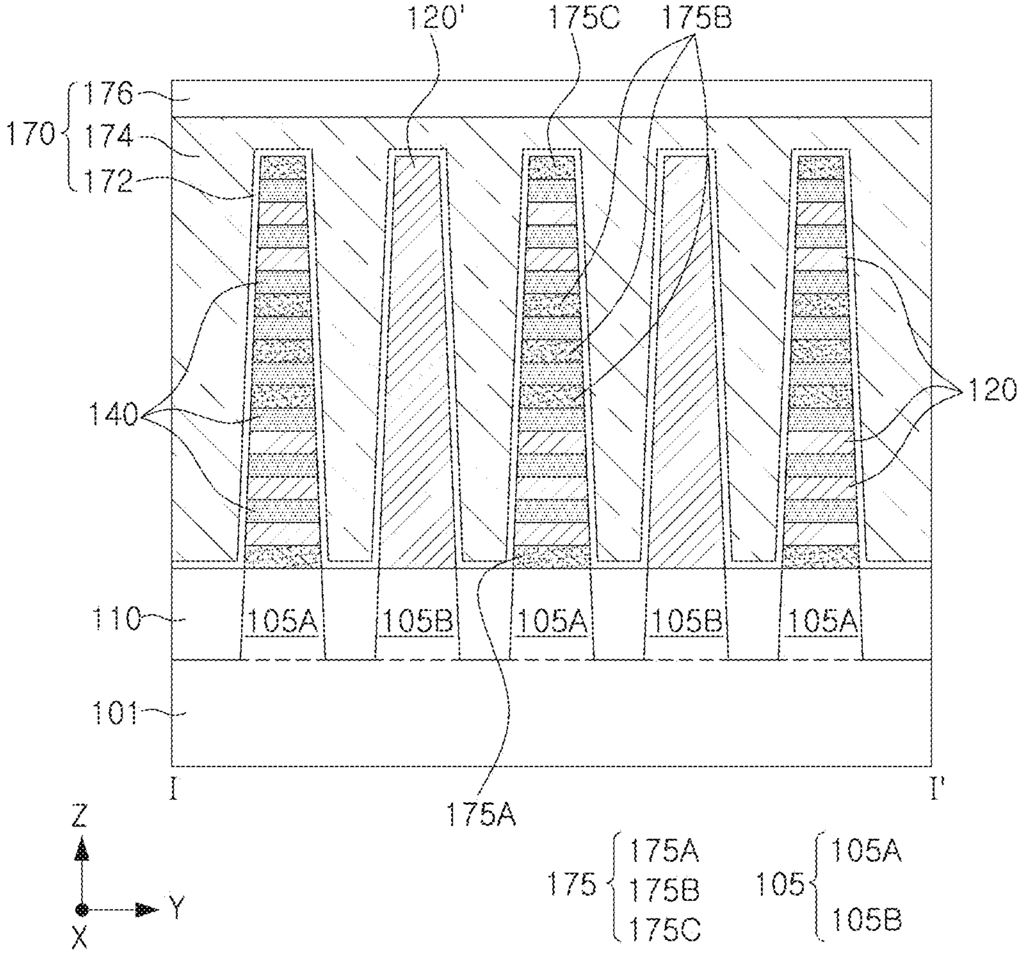
Figure 10B:
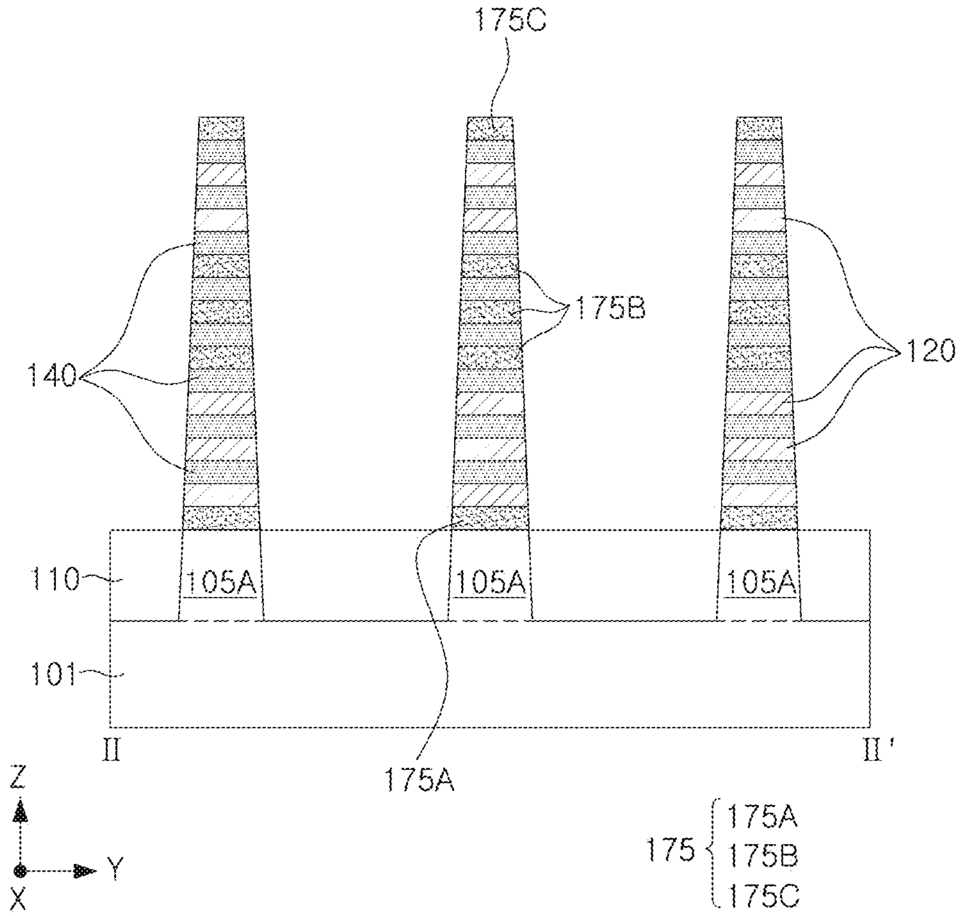

Referring to FIGS. 10A and 10B, sacrificial barrier layers 175' may be removed and barrier layers 175 may be formed.

The sacrificial barrier layers 175' may be formed of a material having etch selectivity with respect to the sacrificial layers 120 and the plurality of channel layers 140. According to various example embodiments, the plurality of channel layers 140 may include silicon (Si), and the sacrificial barrier layers 175' may include silicon germanium (SiGe). A concentration of germanium included in the sacrificial barrier layers 175' may be higher than a concentration of germanium included in the sacrificial layers 120.

Figure 11:
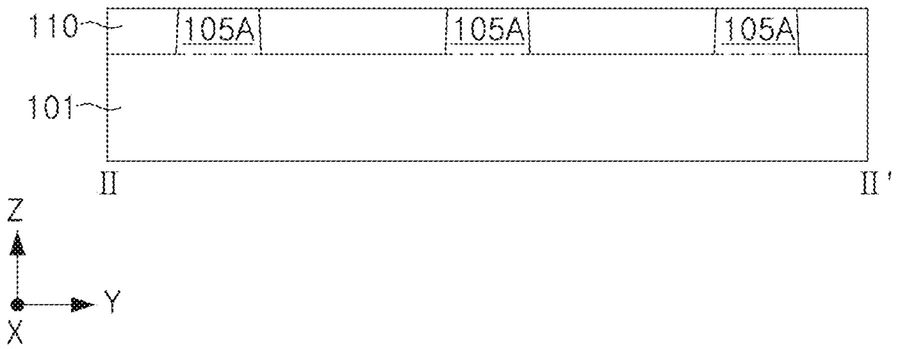

Referring to FIG. 11, sacrificial layers 120, a plurality of channel layers 140, and barrier layers 175 may be removed from side surfaces of the sacrificial gate structures 170.

The sacrificial layers 120, the plurality of channel layers 140, and the barrier layers 175 may be removed by recessing the active structures on the first active regions 105A to a depth, such as a dynamically determined depth (or, alternatively, a predetermined depth) from the upper surfaces thereof through an etching process. In this case, the first active regions 105A and the device isolation layer 110 may be partially removed. The upper surfaces of the first active regions 105A and the device isolation layer 110 may be formed to be lower than the upper surfaces of the first active regions 105 and the device isolation layer 110 in FIG. 10B.

Referring to FIG. 12, first source/drain regions 150A and a first sacrificial epitaxial layer 190A may be formed on the substrate 101 and the active region 105.

The first source/drain regions 150A may be grown and formed from the upper surfaces of the first active regions 105A of FIG. 11, and the side surfaces of the sacrificial layers 120 and the plurality of channel layers 140 thereof, for example, by a selective epitaxial process. The first source/drain regions 105A may include impurities by in-situ doping and/or ion implantation, and may also include a plurality of layers having different doping elements and/or doping concentrations. According to various example embodiments, the first source/drain regions 105A contacting the upper surfaces of the first source/drain regions 105A may be formed from the level of the upper surfaces of the first active regions 105A of FIG. 11 to a level of the upper surfaces of the first active regions 105A of FIG. 10B. The first source/drain regions 150A spaced apart from the first active regions 105A among the first source/drain regions 150A may be formed between the lower barrier layer 175A (see FIG. 2A) and intermediate barrier layers 175B (see FIG. 2A).

The first sacrificial epitaxial layer 190A may be grown and formed from an upper surface of the substrate 101 and side surfaces of the auxiliary sacrificial layers 175' by, for example, a selective epitaxial process. According to various example embodiments, the upper surface of the first sacrificial epitaxial layer 190A may be disposed on a level higher than the upper surfaces of the first source/drain regions 150A.

Figure 13:
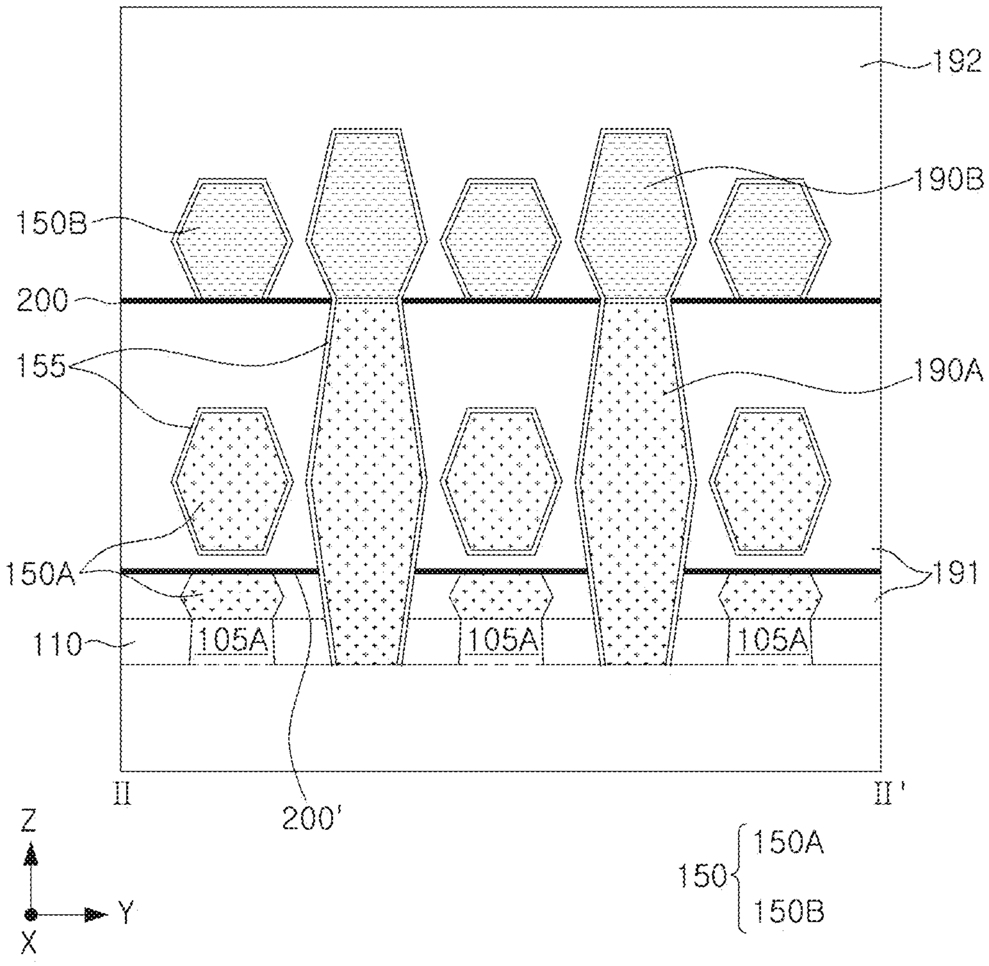

Referring to FIG. 13, second source/drain regions 150B on the first source/drain regions 150A and a second sacrificial epitaxial layer 190B on the first sacrificial epitaxial layer 190A may be formed. First and second interlayer insulating layers 191 and 192, a capping layer 155, and a boundary layer 200 may be formed.

The capping layer 155 and the first interlayer insulating layer 191 may be formed to cover the first source/drain regions 150A. The boundary layer 200 may be formed to cover an upper surface of the first interlayer insulating layer 191. The preliminary boundary layer 200' may be formed to cover upper surfaces of the first source/drain regions 150A that are in contact with upper surfaces of the first active regions 105A.

The second source/drain regions 150B may be formed to be spaced apart from the first source/drain regions 150A in a vertical direction perpendicular to the upper surfaces of the first active regions 105A. The first source/drain regions 150A may be grown and formed from side surfaces of the sacrificial layers 120 and the plurality of channel layers 140 by, for example, a selective epitaxial process.

A second sacrificial epitaxial layer 190B may be formed on the first sacrificial epitaxial layer 190A. The second sacrificial epitaxial layer 190B may be grown and formed from side surfaces of the auxiliary sacrificial layers 120' (see FIG. 10A) by, for example, a selective epitaxial process. According to various example embodiments, an upper surface of the second sacrificial epitaxial layer 190B may be disposed on a higher level than or above the upper surfaces of the second source/drain regions 150B.

The capping layer 155 and the second interlayer insulating layer 192 may be formed to cover the second source/drain regions 150B and the second sacrificial epitaxial layer 190B.

Figure 14:
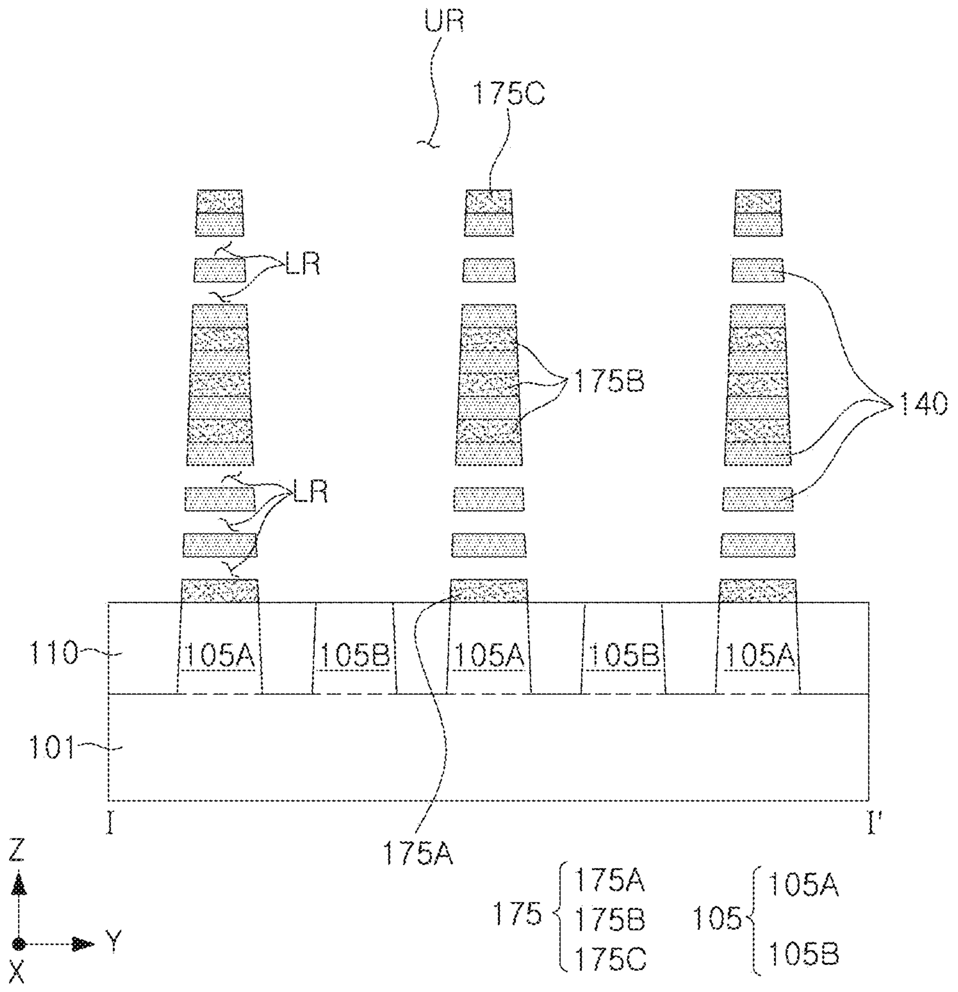

Referring to FIG. 14, the sacrificial layers 120, the auxiliary sacrificial layers 120', and the sacrificial gate structures 170 may be removed.

Referring to FIG. 10A together, the sacrificial layers 120, the auxiliary sacrificial layers 120', and the sacrificial gate structures 170 may be selectively removed with respect to the first and second interlayer insulating layers 191 and 192 and the plurality of channel layers 140. First, the sacrificial gate structures 170 may be removed to form upper gap regions UR, and then the sacrificial layers 120 and the auxiliary sacrificial layers 120' exposed through the upper gap regions UR may be removed to form lower gap regions LR. For example, when the sacrificial layers 120 and the auxiliary sacrificial layers 120' include silicon germanium (SiGe) and the plurality of channel layers 140 include silicon (Si), the sacrificial layer Fields 120 may be selectively removed by performing a wet etching process using peracetic acid as an etchant.

Figure 15:
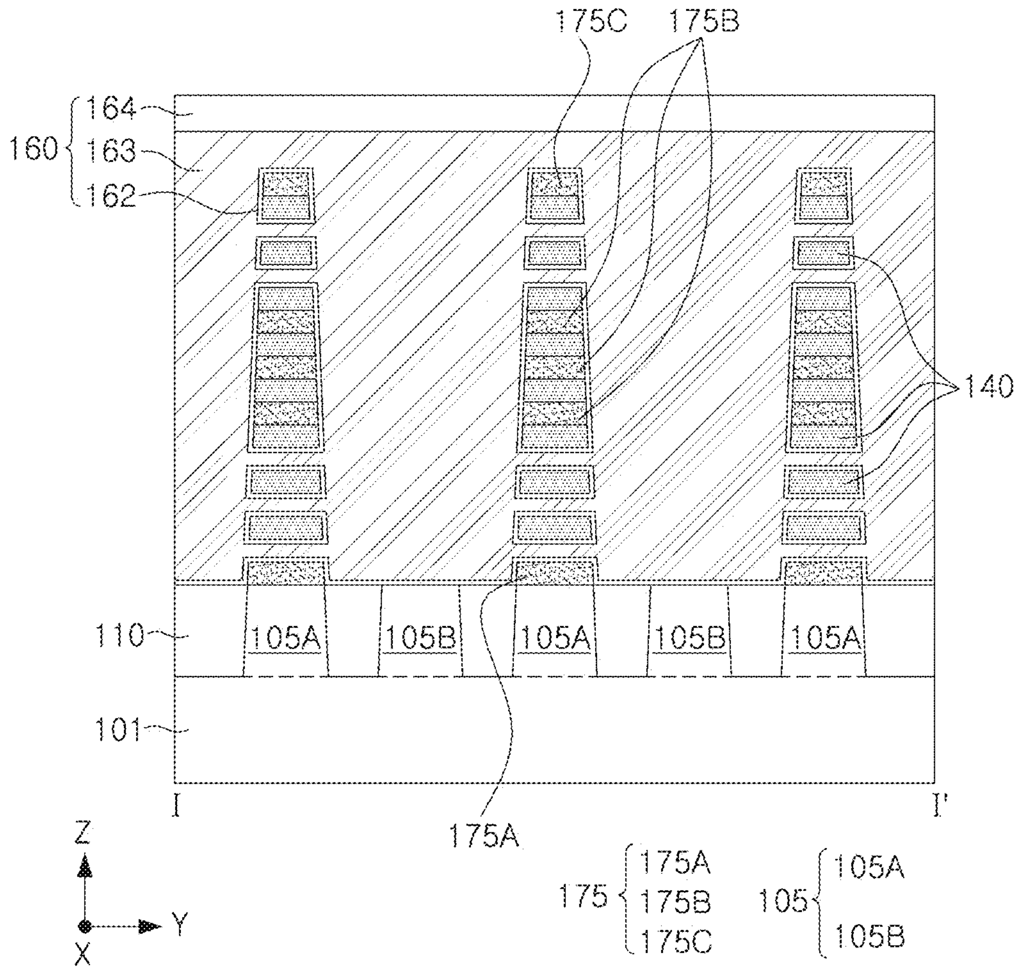

Referring to FIG. 15, a gate structure 160 may be formed in upper gap regions UR and lower gap regions LR.

The gate dielectric layer 162 may be formed, e.g., deposited and/or grown, to conformally cover inner surfaces of the upper gap regions UR and the lower gap regions LR. The gate electrode layer 163 may be formed to completely fill the upper gap regions UR and the lower gap regions LR. The gate electrode layer 163 and the gate spacer layers may be removed to a predetermined depth from upper portions of the upper gap regions UR. A gate capping layer 164 may be formed in a region from which the gate electrode layer 163 and the gate spacer layers are removed in the upper gap regions UR. Accordingly, a gate structure 160 including the gate dielectric layer 162, the gate electrode layer 163, the gate spacer layers, and the gate capping layer 164 may be formed.

Figure 16:
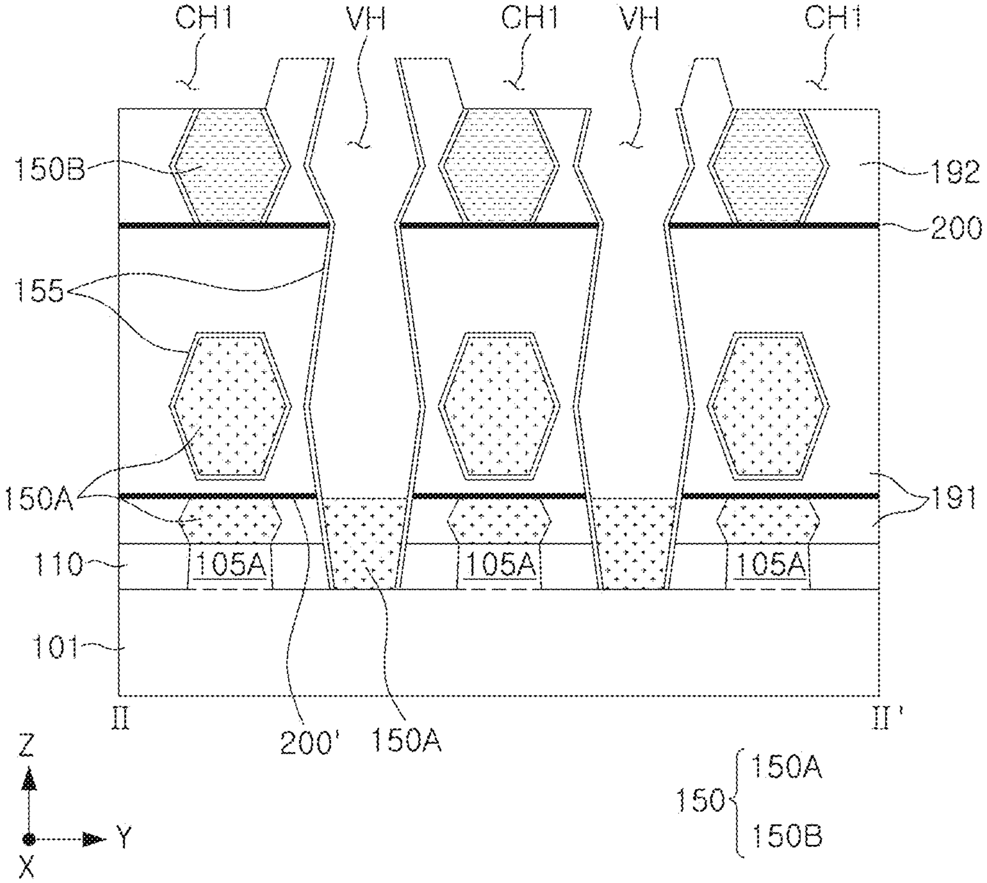

Referring to FIG. 16, at least a portion of the second interlayer insulating layer 192 and the first and second sacrificial epitaxial layers 190A and 190B may be removed.

A portion of the second interlayer insulating layer 192 may be removed by a planarization process. An upper surface of the second epitaxial layer 190B may be exposed to sequentially remove the second sacrificial epitaxial layer 190B and the first sacrificial epitaxial layer 190A. In this case, a portion of the first sacrificial epitaxial layer 190A may remain and a via hole VH may be formed.

First contact holes CH1 may be formed to expose upper surfaces of the second source/drain regions 150B.

Figure 17:
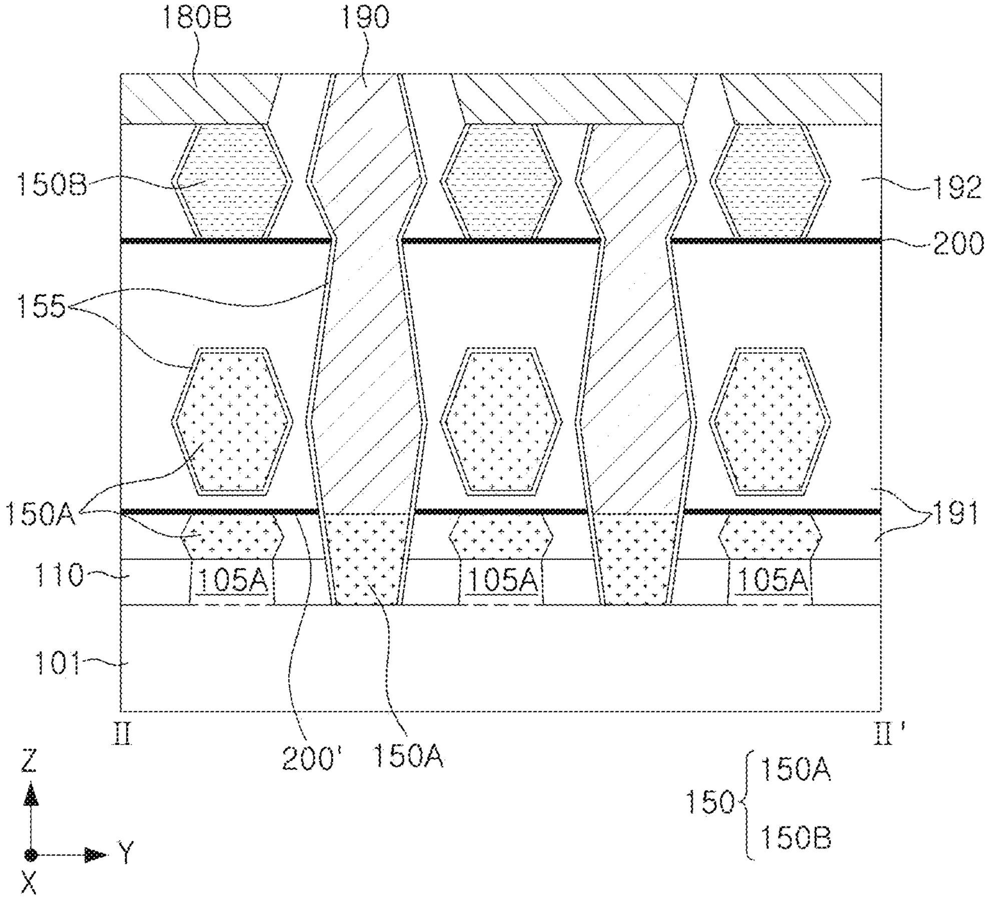

Referring to FIG. 17, a via structure 190 and a second contact structure 180B may be formed.

A via structure 190 may be formed to fill a via hole VH. The via structure 190 may be formed on the first sacrificial epitaxial layer 190A by, for example, a selective crystal growth method, but an example embodiment thereof is not limited thereto. Alternatively or additionally, according to some example embodiments, it may be formed using an atomic layer deposition (ALD) process or a chemical vapor deposition (CVD) process. According to various example embodiments, since the via structure 190 is formed in a space where the first sacrificial epitaxial layer 190A and the second sacrificial epitaxial layer 190B are removed, the via structure 190 may include a portion in which a width of the via structure 190 increases and then decreases or decreases and then increases in a Z-direction.

A second contact structure 180B may be formed to fill a first contact hole CH1. The second contact structure 180B may be formed using the same process as the via structure 190, but an example embodiment thereof is not limited thereto. A planarization process may be performed after forming the via structure 190 and the second contact structure 180B.

Figure 18A:
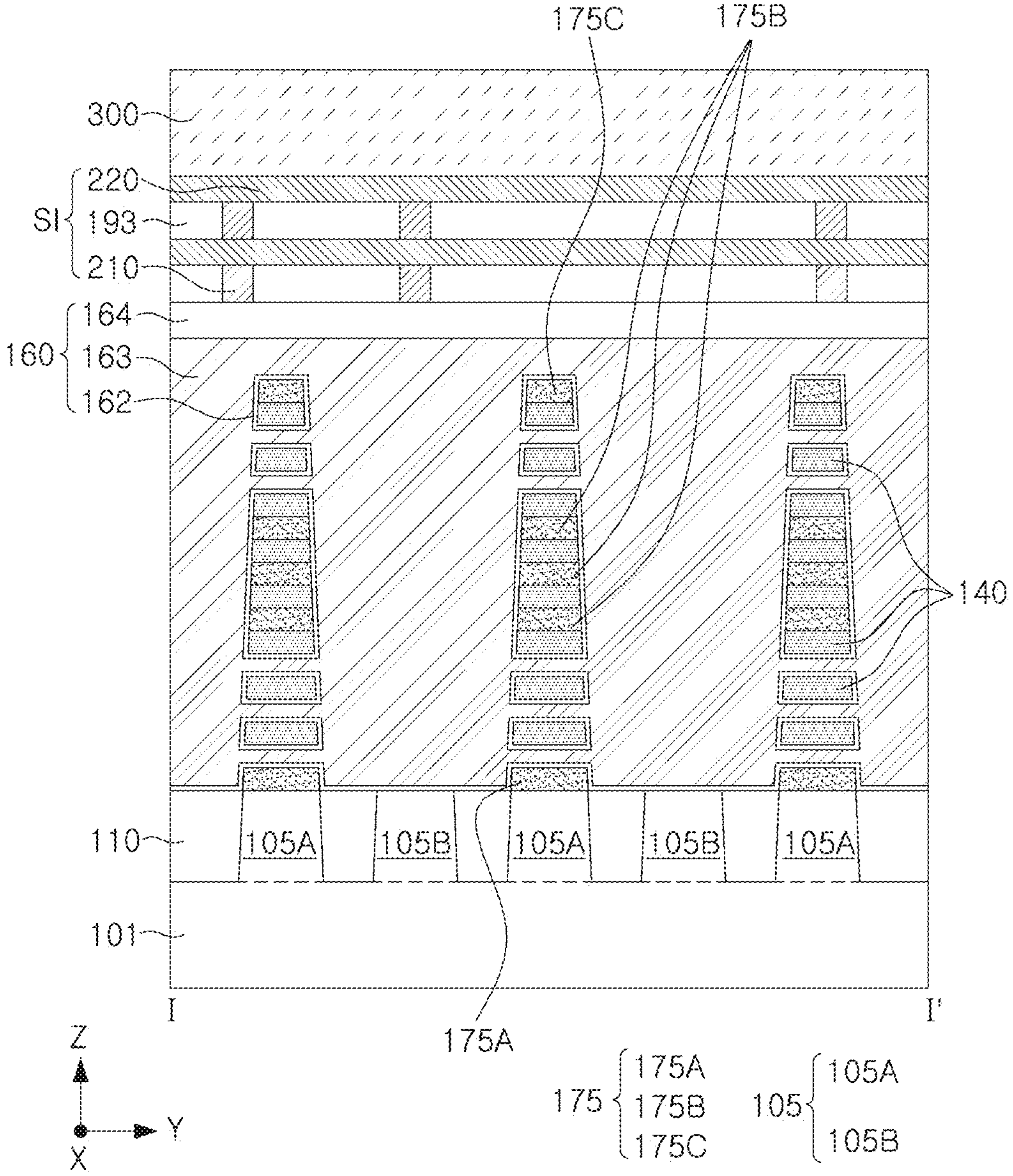
Figure 18B:
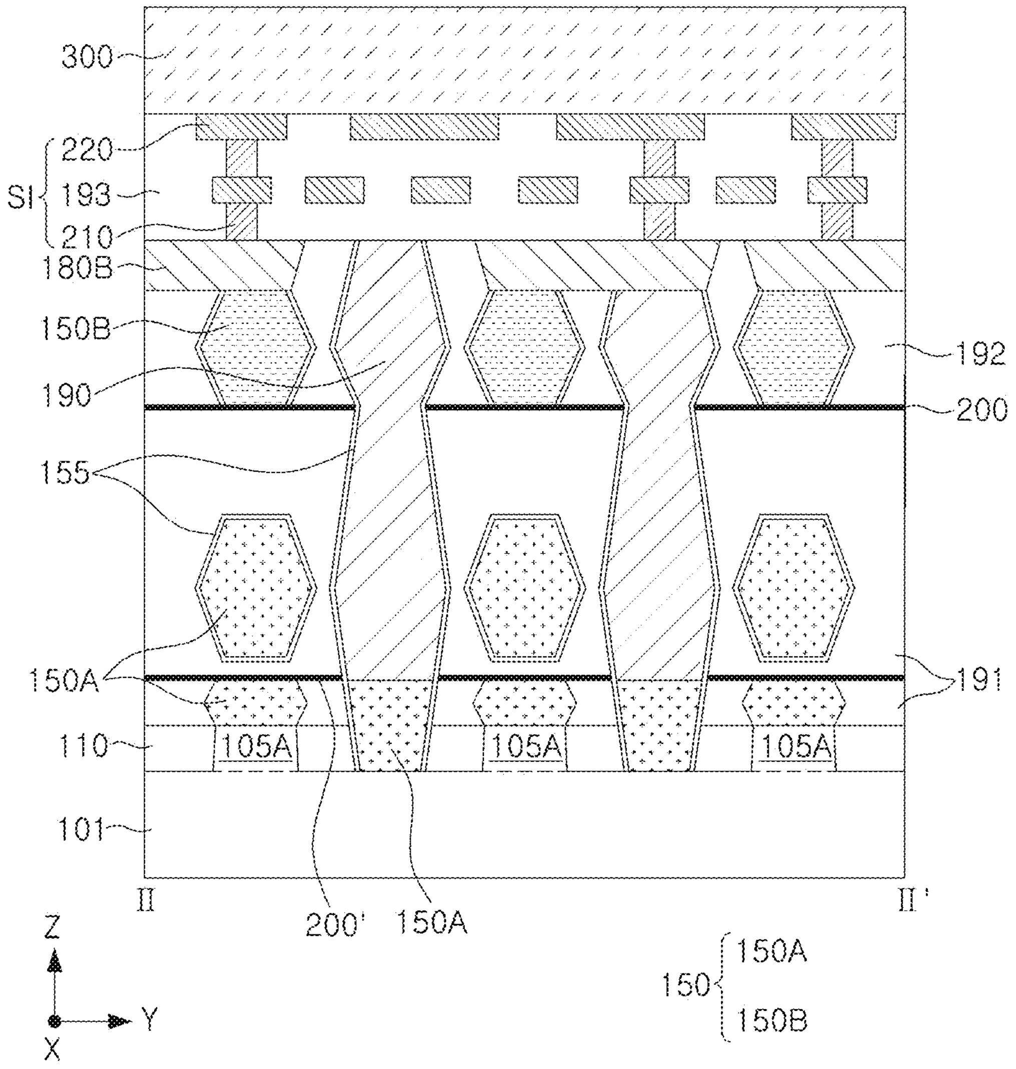

Referring to FIGS. 18A and 18B, an interconnection structure SI may be formed and a carrier substrate 300 may be attached. An interconnection structure SI may be formed on a second contact structure 180B and a via structure 190.

The carrier substrate 300 may be attached on the gate capping layer 164 and the interconnection structure SI.

Figure 19A:
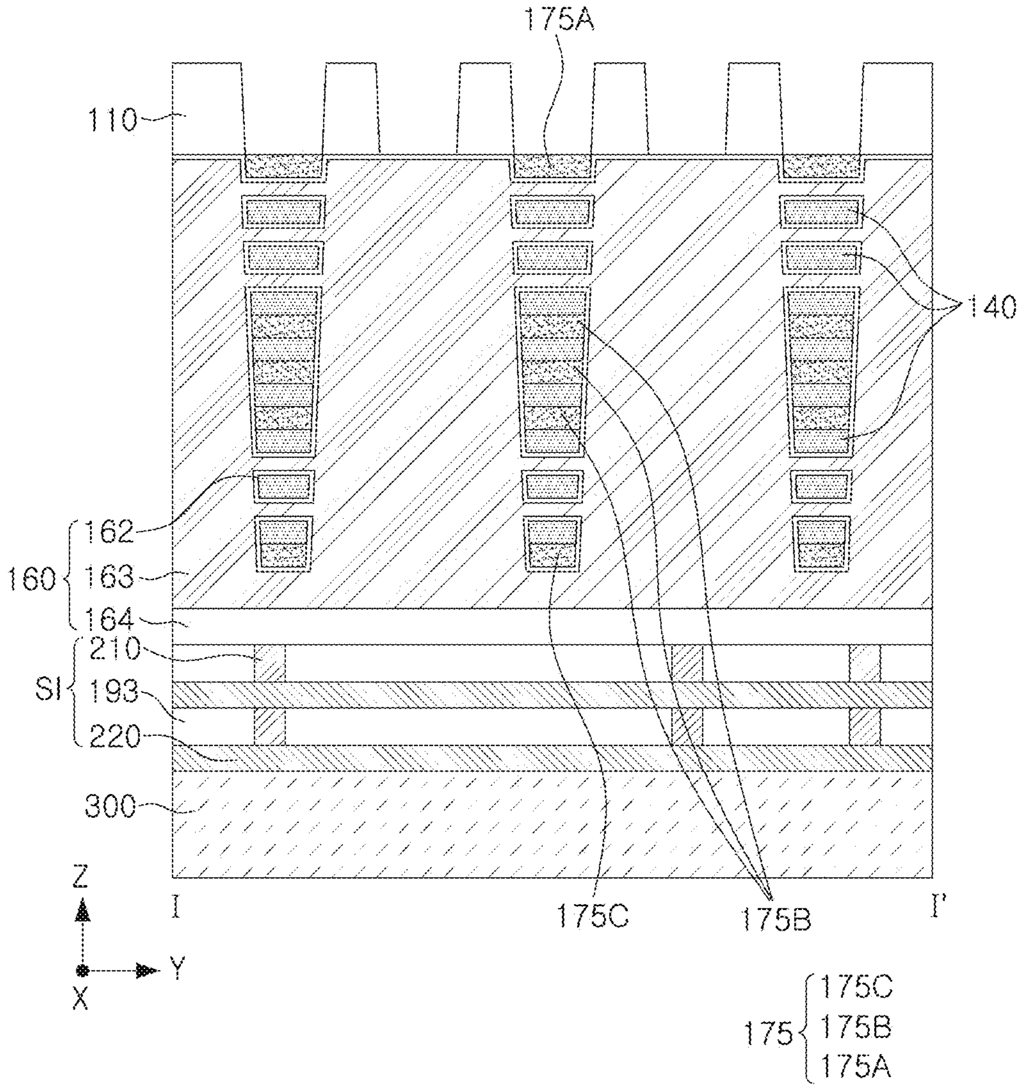
Figure 19B:
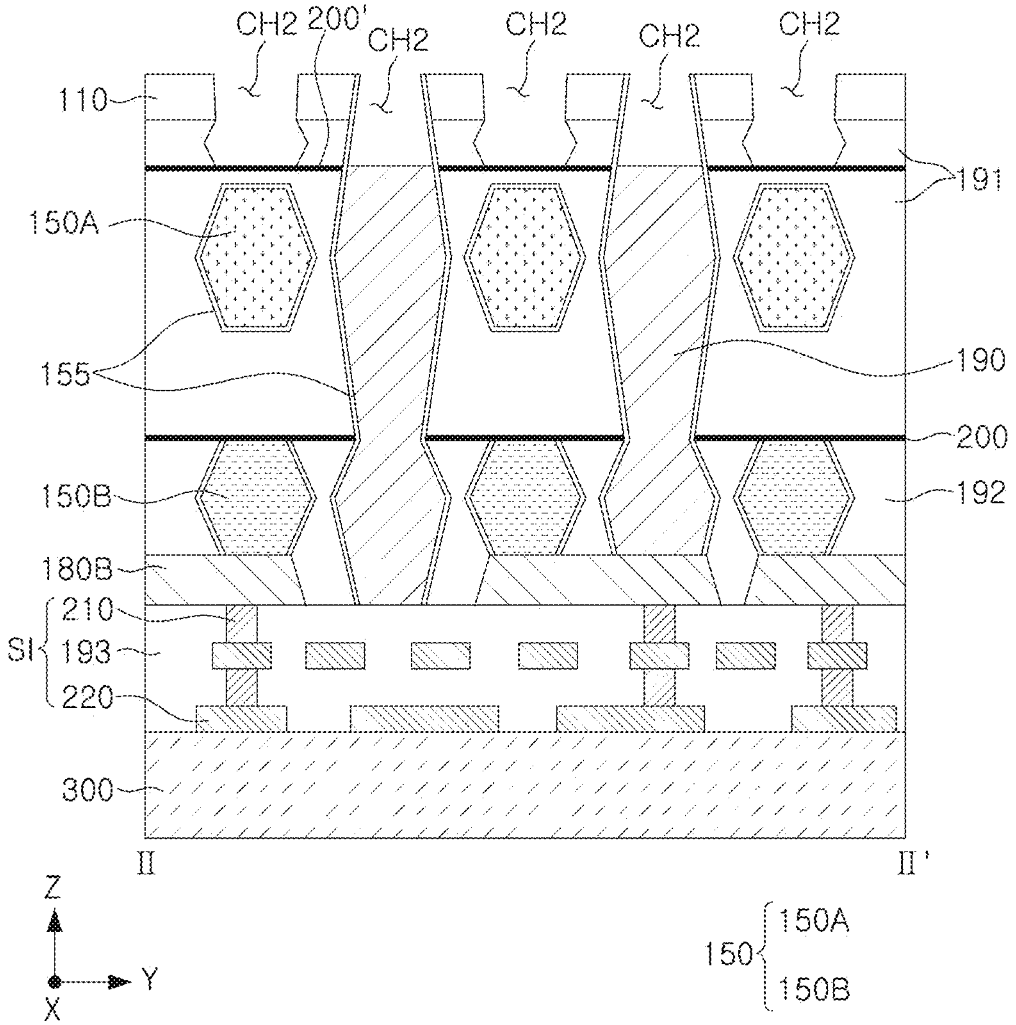

Referring to FIGS. 19A and 19B, a back grinding process turning over carrier substrate 300 is turned over and removing at least a portion of the substrate 101 and the active region 105 may be performed. The gate electrode layer 163, the barrier layers 175, and the device isolation layer 110 may be exposed by the back grinding process. In addition, a portion of a via structure 190 may be exposed. Thereby, a second contact hole CH2 may be formed.

Alternatively or additionally, according to some example embodiments, when the back grinding process is performed, portions of the active region 105 and the substrate 101 may remain on the gate electrode layer 163. The active regions 105 may be disposed on insulating patterns 102, and extend in a first direction. Among the active regions 105, first active regions 105A may be disposed between the insulating patterns 102 and an uppermost barrier layer 175C among the barrier layers 175, and second active regions 105B may be disposed between the insulating patterns 102 and the gate structure 160.

Next, referring back to FIGS. 2A and 2B, the device isolation layer 110, a portion of the first interlayer insulating layer 191, and a preliminary boundary layer 200' may be removed. A first contact structure 180A may be formed to fill second contact holes CH2 by patterning the same so that upper surfaces of the first source/drain regions 150A and the via structure 190 are exposed. The first contact structure 180A may be formed through the same process as a process of forming the via structure 190, but is not limited thereto. The carrier substrate 300 may be removed. Although not illustrated, a semiconductor device having a Back Side Power Delivery Network (BSPDN) structure may be provided by forming an interconnection structure such as a power rail below a first contact structure 180A. Power may be supplied from the BSPDN to the first source/drain regions 150A and the second source/drain regions 150B through the first contact structure 180A. Accordingly, a semiconductor device 100 having improved integration and electrical characteristics may be provided.

As set forth above, according to various example embodiments of inventive concepts, in a semiconductor device, resistance is reduced by a via structure including a portion in which a width of the via structure increases in a vertical direction and then decreases or decreases and then increases, so that a semiconductor device having an improved degree of integration and electrical characteristics may be provided.

The various and/or advantageous advantages and/or effects of inventive concepts are not limited to the above description, and may be more easily understood in the course of describing some specific embodiments of inventive concepts. While some example embodiments have been shown and described above, it will be apparent to those skilled in the art that modifications and variations could be made without departing from the scope of inventive concepts, as defined by the appended claims.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While example embodiments have been shown and described above, it will be apparent to those skilled in the art that modifications and variations could be made without departing from the scope of inventive concepts as defined by the appended claims. Additionally, example embodiments are not necessarily mutually exclusive with one another. For example, some example embodiments may include one or more features described with reference to one or more figures, and may also include one or more other features described with reference to one or more other figures.

What is claimed is:

1. A semiconductor device, comprising:

insulating patterns extending in a first direction;

a device isolation layer on side surfaces of the insulating patterns;

gate structures crossing the insulating patterns and extending in a second direction;

source/drain regions on the insulating patterns on at least one side of the gate structures;

a via structure between the gate structures and between the source/drain regions; and contact structures connected to at least one of the via structure or to the source/drain regions, wherein the source/drain regions include first source/drain regions and second source/drain regions spaced apart from the first source/drain regions in a vertical direction, perpendicular to the first direction and the second direction, the via structure extends from a same level as lower surfaces of the first source/drain regions to a same level as upper surfaces of the second source/drain regions, and in a cross-section thereof in the second direction, the via structure includes a portion in which a width of the via structure increases and then decreases or decreases and then increases in the vertical direction, and the contact structures include a first contact structure contacting the lower surfaces of the first source/drain regions, and a second contact structure contacting the upper surfaces of the second source/drain regions.

2. The semiconductor device of claim 1, wherein the first source/drain regions and the second source/drain regions have different conductivity type.

3. The semiconductor device of claim 1, further comprising:

barrier layers on the insulating patterns to be spaced apart from each other in the vertical direction, wherein the source/drain regions are on different levels from the barrier layers.

4. The semiconductor device of claim 3, further comprising:

active regions on the insulating patterns, and extending in the first direction; and a plurality of channel layers on the insulating patterns to be spaced apart from each other in the vertical direction, wherein the active regions are between the insulating patterns and a lowermost barrier layer among the barrier layers, and the barrier layers include an upper barrier layer above an uppermost channel layer among the plurality of channel layers, a lower barrier layer below a lowermost channel layer among the plurality of channel layers, and intermediate barrier layers alternating with the plurality of channel layers.

5. The semiconductor device of claim 1, wherein an upper surface or a lower surface of the via structure is at a same level as an upper surface or a lower surface of at least one of the contact structures.

6. The semiconductor device of claim 1, wherein the contact structures and the via structure include a same material as each other.

7. The semiconductor device of claim 1, wherein the via structure comprises a polycrystalline material.

8. The semiconductor device of claim 7, wherein the via structure comprises a seam along a central axis of the via structure.

9. The semiconductor device of claim 7, wherein the via structure at least partly surrounds a void or a seam.

10. The semiconductor device of claim 1, wherein the via structure comprises a monocrystalline molybdenum layer.

11. The semiconductor device of claim 1, wherein the first contact structure is in contact with a lower surface of the via structure, and the second contact structure is in contact with an upper surface of the via structure.

12. The semiconductor device of claim 1, further comprising:

a boundary layer between upper surfaces of the first source/drain regions and lower surfaces of the second source/drain regions; and a capping layer on the source/drain regions and the via structure.

13. A semiconductor device, comprising:

insulating patterns extending in a first direction;

a device isolation layer on side surfaces of the insulating patterns;

gate structures crossing the insulating patterns and extending in a second direction;

source/drain regions on the insulating patterns on at least one side of the gate structures;

a via structure between the gate structures and between the source/drain regions; and contact structures connected to at least one of the via structure or the source/drain regions, wherein the source/drain regions include first source/drain regions and second source/drain regions spaced apart from the first source/drain regions in a vertical direction, perpendicular to the first direction and to the second direction, the via structure extends from a same level as lower surfaces of the first source/drain regions to a same level as upper surfaces of the second source/drain regions, and in a cross-section thereof in the second direction, the via structure includes a portion in which a width of the via structure decreases from an upper surface of each of the first source/drain regions toward a lower surface of each of the second source/drain regions in the vertical direction, and includes a portion in which a width of the via structure increases and then decreases from an upper surface of each of the second source/drain regions toward a lower surface of each of the second source/drain regions in the vertical direction.

14. The semiconductor device of claim 13, further comprising:

a boundary layer between the lower surfaces of the first source/drain regions and the upper surfaces of the second source/drain regions, wherein, in a first region below the boundary layer, a maximum width of the via structure, is equal to a maximum width of the via structure, in a second region above the boundary layer.

15. The semiconductor device of claim 13, further comprising:

a boundary layer between upper surfaces of the first source/drain regions and lower surfaces of the second source/drain regions, wherein a width of the via structure is minimum on a level of the boundary layer and a lower surface of each of the second source/drain regions.

16. The semiconductor device of claim 15, wherein in a first region below the boundary layer, a level at which the via structure has a maximum width is a same level as a level at which each of the first source/drain regions has a maximum width.

17. The semiconductor device of claim 16, wherein in a second region above the boundary layer, a level at which the via structure has a maximum width is a same level as a level at which each of the second source/drain regions has a maximum width.

18. A semiconductor device, comprising:

insulating patterns extending in a first direction;

a device isolation layer surrounding the insulating patterns;

a plurality of channel layers on the insulating patterns spaced apart from each other in a vertical direction, perpendicular to an upper surface of the device isolation layer;

barrier layers on the insulating patterns spaced apart from each other in the vertical direction;

gate structures crossing the insulating patterns and surrounding the plurality of channel layers, respectively, and extending in a second direction;

source/drain regions on the insulating patterns on at least one side of the gate structures;

a via structure between the gate structures and between the source/drain regions; and contact structures connected to at least one of the via structure or the source/drain regions, wherein the barrier layers include an upper barrier layer above an uppermost channel layer among the plurality of channel layers, a lower barrier layer below a lowermost channel layer among the plurality of channel layers, and intermediate barrier layers alternating with the plurality of channel layers, the source/drain regions include first source/drain regions and second source/drain regions spaced apart from the first source/drain regions in the vertical direction, the via structure extends from a same level as lower surfaces of the first source/drain regions to a same level as upper surfaces of the second source/drain regions, and in a cross-section thereof in the second direction, a maximum width of the via structure is above the intermediate barrier layers and below the upper barrier layer or on a level higher than the lower barrier layer and lower than the intermediate barrier layers.

19. The semiconductor device of claim 18, wherein the lower surfaces of the first source/drain regions are a same level as an upper surface of the lower barrier layer and a lower surface of the via structure.

20. The semiconductor device of claim 18, wherein the first source/drain regions are on a level lower than the intermediate barrier layers and higher than the lower barrier layer, and the second source/drain regions are on a level lower than the upper barrier layer and higher than the intermediate barrier layers.

* * * * *